(12) United States Patent
Goto

(10) Patent No.: US 9,582,729 B2
(45) Date of Patent: Feb. 28, 2017

(54) IMAGE-BASED DETECTION OF THE BOUNDARY BETWEEN A FIRST PART AND A SECOND PART

(71) Applicant: GE MEDICAL SYSTEMS GLOBAL TECHNOLOGY COMPANY, LLC, Waukesha, WI (US)

(72) Inventor: Takao Goto, Tokyo (JP)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/443,203

(22) PCT Filed: Nov. 4, 2013

(86) PCT No.: PCT/US2013/068244
§ 371 (c)(1),
(2) Date: May 15, 2015

(87) PCT Pub. No.: WO2014/085027
PCT Pub. Date: Jun. 5, 2014

(65) Prior Publication Data
US 2015/0310299 A1  Oct. 29, 2015

(30) Foreign Application Priority Data
Nov. 30, 2012  (JP) .................. 2012-262965

(51) Int. Cl.
*G06K 9/00* (2006.01)
*G06K 9/46* (2006.01)
(Continued)

(52) U.S. Cl.
CPC ......... *G06K 9/4604* (2013.01); *G01R 33/543* (2013.01); *G01R 33/5608* (2013.01);
(Continued)

(58) Field of Classification Search
CPC .............. G01R 33/543; G01R 33/5608; G01R 33/56509; G01R 33/5676;
(Continued)

(56) References Cited

U.S. PATENT DOCUMENTS 7,558,611 B2 *  7/2009  Arnold .................. G06T 7/0012
128/922
7,894,647 B2 *  2/2011  Zhou .................... G06K 9/3216
382/103
(Continued)

FOREIGN PATENT DOCUMENTS

EP         2604189 A1     6/2013
JP       2004-052873 A    2/1992
(Continued)

OTHER PUBLICATIONS

English Translation of the JP OA for Application No. 2012-262965. Office Action dated Oct. 20, 2015.
(Continued)

*Primary Examiner* — Tom Y Lu

(57) ABSTRACT

A detection apparatus for detecting the position of a boundary between a first part and a second part of a subject, includes a pixel extraction unit for extracting a plurality of candidate pixels acting as candidates for a pixel situated on the boundary on the basis of image data of a first section crossing the first part and the second part, and a pixel specification unit for specifying the pixel situated on the boundary from within the plurality of candidate pixels by using an identifier which has been prepared by using an algorithm of machine learning.

19 Claims, 29 Drawing Sheets

(51) Int. Cl.
*G01R 33/54* (2006.01)
*G01R 33/56* (2006.01)
*G06T 7/00* (2006.01)
*G06K 9/62* (2006.01)
*G01R 33/565* (2006.01)
*G01R 33/567* (2006.01)

(52) U.S. Cl.
CPC .............. *G06K 9/46* (2013.01); *G06K 9/627* (2013.01); *G06T 7/0012* (2013.01); *G06T 7/0083* (2013.01); *G01R 33/5676* (2013.01); *G01R 33/56509* (2013.01); *G06K 2009/4666* (2013.01); *G06T 2207/10088* (2013.01); *G06T 2207/30056* (2013.01); *G06T 2207/30061* (2013.01)

(58) Field of Classification Search
CPC ............. G06K 2009/4666; G06K 9/46; G06K 9/4604; G06K 9/627; G06T 2207/10088; G06T 2207/30056; G06T 2207/30061; G06T 7/0012; G06T 7/0083
See application file for complete search history.

(56) References Cited

U.S. PATENT DOCUMENTS

| | | | | |
|---|---|---|---|---|
| 7,929,739 | B2* | 4/2011 | Li | G06K 9/34 382/128 |
| 8,369,590 | B2* | 2/2013 | Wang | G06T 7/0081 382/128 |
| 2007/0159172 | A1 | 7/2007 | Sugiura | |
| 2013/0144160 | A1 | 6/2013 | Sakuragi et al. | |

FOREIGN PATENT DOCUMENTS

| | | |
|---|---|---|
| JP | 2007-249115 A | 9/1995 |
| JP | 2004-024669 A | 1/2004 |
| JP | 2012-034988 A | 2/2012 |
| JP | 5345610 B2 | 11/2013 |
| WO | 2007037848 A2 | 4/2007 |
| WO | 2012020547 A1 | 2/2012 |

OTHER PUBLICATIONS

GOTO: "Automated Navigator Tracker positioning for MRI liver scans": Proceedings of the International Society for Magnetic Resonance in Medicine, 20th Annual Meeting Proceeding, May 5, 2012.
Powell et. al.: "Automated Image Segmentation Using Support Vector Machines": Proceedings of Spie, Medical Imaging 2007; Image Processing, vol. 6512, 2007, pp. 65122S-1-65122S-9.
GOTO: "Automated scan prescription of MRI liver scans", International Society for Magnetic Resonance in Medicine, 19th Annual Meeting Proceedings, May 9, 2011, p. 4533.
International Search Report dated Oct. 4, 2014 which was issued in connection with PCT Patent Application No. PCT/US13/68244 which was filed on Nov. 4, 2013.

* cited by examiner

IMAGE-BASED DETECTION OF THE BOUNDARY BETWEEN A FIRST PART AND A SECOND PART

BACKGROUND OF THE INVENTION

The present invention relates to a detection device for detecting the position of a boundary between a first part and a second part of a subject, a magnetic resonance device to which that detection device has been applied, a detection method of detecting the position of a boundary between a first part and a second part of a subject, and a program used for detecting the position of a boundary between a first part and a second part of a subject.

As a method of imaging a part which moves with respiration of a subject, a method of using a navigator sequence for acquiring a respiratory signal of the subject is known (see Patent Document 1).

[Patent Document 1] Japanese Patent Application Laid-Open No. 2011-193884

SUMMARY OF THE INVENTION

In a case where a respiratory signal of a subject is to be acquired by using a navigator sequence, it is necessary to set a navigator region for collecting navigator echoes. The navigator region is set, for example, on the boundary between the lung and the liver. Since the liver moves with respiration of the subject, the respiratory signals of the subject can be collected by setting the navigator region on the boundary between the lung and the liver. As one example of the method of setting the navigator region, there exists a method that image data is acquired in advance, and an operator finds out the boundary between the lung and the liver while looking at that image data to set the navigator region. However, in this method, the operator himself has to find out the boundary between the lung and the liver, and it becomes complicated work for the operator. Thus, although development of a technology of automatically detecting the boundary between the lung and the liver is now being attempted, there exists such a problem that it is difficult to improve detection precision of the boundary. Therefore, a technology which is capable of improving the detection precision of the boundary is being asked for. A first viewpoint of the present invention is a detection device for detecting the position of a boundary between a first part and a second part of a subject, the detection device including; a pixel extraction means for extracting a plurality of candidate pixels acting as candidates for a pixel situated on the boundary on the basis of image data of a first section crossing the first part and the second part and a pixel specification means for specifying the pixel situated on the boundary from within the plurality of candidate pixels by using an identifier which has been prepared by using an algorithm of machine learning.

A second viewpoint of the present invention is a magnetic resonance device for detecting the position of a boundary between a first part and a second part of a subject, the magnetic resonance device including; a pixel extraction means for extracting a plurality of candidate pixels acting as candidates for a pixel situated on the boundary on the basis of image data of a first section crossing the first part and the second part, and a pixel specification means for specifying the pixel situated on the boundary from within the plurality of candidate pixels by using an identifier which has been prepared by using an algorithm of machine learning.

A third viewpoint of the present invention is a detection method of detecting the position of a boundary between a first part and a second part of a subject, the detection method including; the pixel extraction step of extracting a plurality of candidate pixels acting as candidates for a pixel situated on the boundary on the basis of image data of a first section crossing the first part and the second part, and the pixel specification step of specifying the pixel situated on the boundary from within the plurality of candidate pixels by using an identifier which has been prepared by using an algorithm of machine learning.

A fourth viewpoint of the present invention is a program for a detection device for detecting the position of a boundary between a first part and a second part of a subject, the program making a computer execute; a pixel extraction process of extracting a plurality of candidate pixels acting as candidates for a pixel situated on the boundary on the basis of image data of a first section crossing the first part and the second part, and a pixel specification process of specifying the pixel situated on the boundary from within the plurality of candidate pixels by using an identifier which has been prepared by using an algorithm of machine learning.

Since the pixel situated on the boundary is specified from within the plurality of candidate pixels by using the identifier prepared by using the algorithm of machine learning, it becomes possible to improve the detection precision of the position of the boundary.

DRAWINGS

DETAILED DESCRIPTION OF THE INVENTION

Although, in the following, modes for embodying the invention will be described, the present invention is not limited to the following embodiments.

Figure 1:
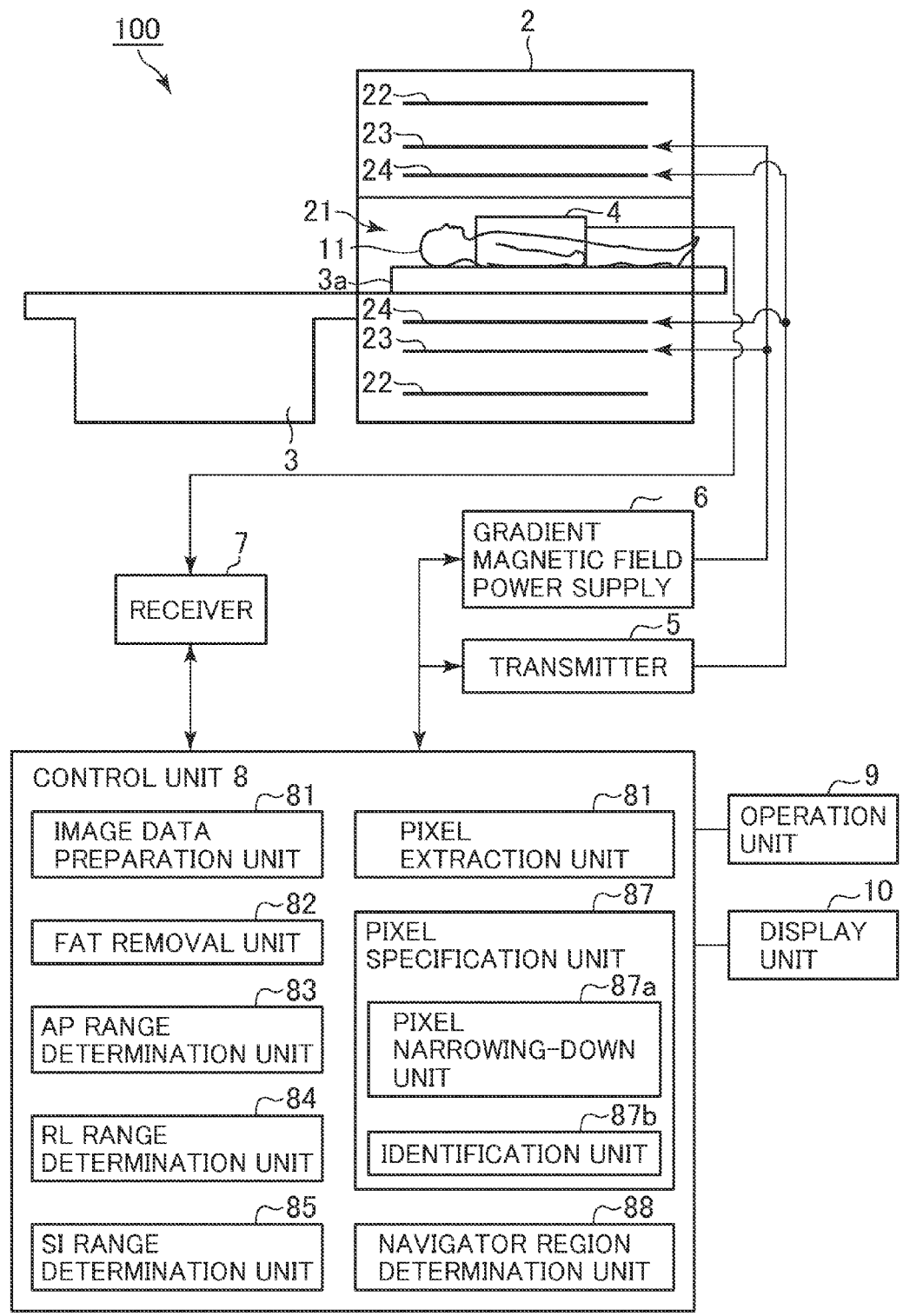
FIG. 1 is a schematic diagram of a magnetic resonance device of a first embodiment of the present invention.

FIG. 1 is a schematic diagram of a magnetic resonance device of a first embodiment of the present invention. The magnetic resonance device (hereinafter, will be referred to as an "MR device". MR: Magnetic Resonance) 100 has a magnet 6, a table 3, a receiver coil 4 and the like.

The magnet 2 has a bore 21 within which a subject 11 is to be contained. In addition, the magnet 2 has a superconducting coil 22, a gradient coil 23 and an RF coil 24. The superconducting coil 22 applies a magnetostatic field, the gradient coil 23 applies a gradient magnetic field, and the RF coil transmits an RF signal. Incidentally, a permanent magnet may be used in place of the superconducting coil 22.

The table 3 has a cradle 3a for supporting the subject 11. The cradle 3a is configured to move into the bore 21. The subject 11 is carried into the bore 21 by the cradle 3a. The receiver coil 4 is attached to the subject 11 and receives a magnetic resonance signal from the subject 11.

The MR device 100 further has a transmitter 5, a gradient magnetic field power source 6, a receiver 7, a control unit 8, an operation unit 9, a display unit 10 and the like. The transmitter 5 supplies a current to the RF coil 24, the gradient magnetic field power source 6 supplies a current to the gradient coil 23. The receiver 7 executes signal processing such as detection or the like on a signal received from the receiver coil 4.

The control unit 8 controls operations of respective units of the MR device 100 so as to implement various operations of transferring required information to the display unit 10, reconfiguring an image on the basis of data received from the receiver 7 and others of the MR device 100. The control unit 8 has an image data preparation means 81 to a navigator region determination means 88 and the like.

The image data preparation means 81 prepares image data of an imaged part of the subject 11. A fat removing means 82 removes the fat from the image data that the image data preparation means 81 has prepared. An AP range determination means 83 determines a range in an AP direction of the liver of the subject 11. An RL range determination means 84 determines a range in an RL direction which is high in possibility that an upper end of the liver is situated. An SI range determination means 85 determines a range in an SI direction which is high in possibility that the boundary between the lung and the liver is situated. A pixel extraction means 86 extracts candidate pixels acting as candidates for a pixel which is situated on the boundary between the lung and the liver. A pixel specification means 87 has a pixel narrowing-down means 87a and an identification means 87b. The pixel narrowing-down means 87a narrows down pixels which are high in possibility that they are situated on the boundary between the lung and the liver from within the extracted candidate pixels. The identification means 87b specifies the pixel which is situated on the boundary between the lung and the liver from within the narrowed-down pixels using an identifier. A navigator region determination means 88 determines the position of the navigator region on the basis of the specified pixel.

The control unit 8 is one example configuring the image data preparation means 81 to the navigator region determination means 88 and functions as these means by executing a predetermined program. Incidentally, the control unit 8 corresponds to the detection device.

The operation unit 9 is operated by an operator to input various pieces of information into the control unit 8. The display unit 10 displays the various pieces of information. The MR device 100 is configured as mentioned above.

Figure 2:
FIG. 2 is a diagram showing scans executed in the first embodiment.
Figure 3:
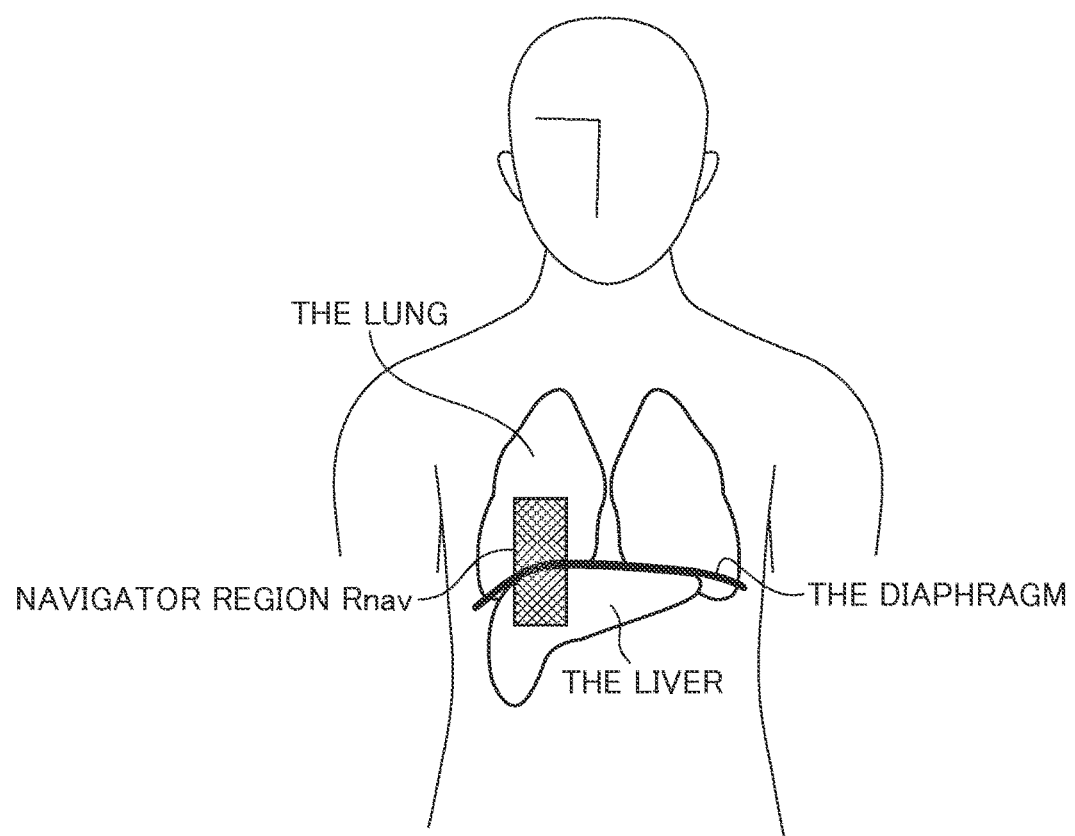
FIG. 3 is a diagram schematically showing a part to be imaged.

FIG. 2 is a diagram showing scans to be executed in the first embodiment, and FIG. 3 is a diagram schematically showing an imaged part. In the present embodiment, a localizer scan LS, a main scan MS and the like are executed.

The localizer scan LS is a scan executed for setting the navigator region $R_{nav}$ (see FIG. 3). The navigator region $R_{nav}$ is a region to be set for collecting respiratory signals of the subject. The main scan MS is adapted to collect the respiratory signals from the navigator region $R_{nav}$ and to collect image data of a part including the liver. In the following, a flow when executing the localizer scan LS and the main scan MS will be described.

Figure 4:
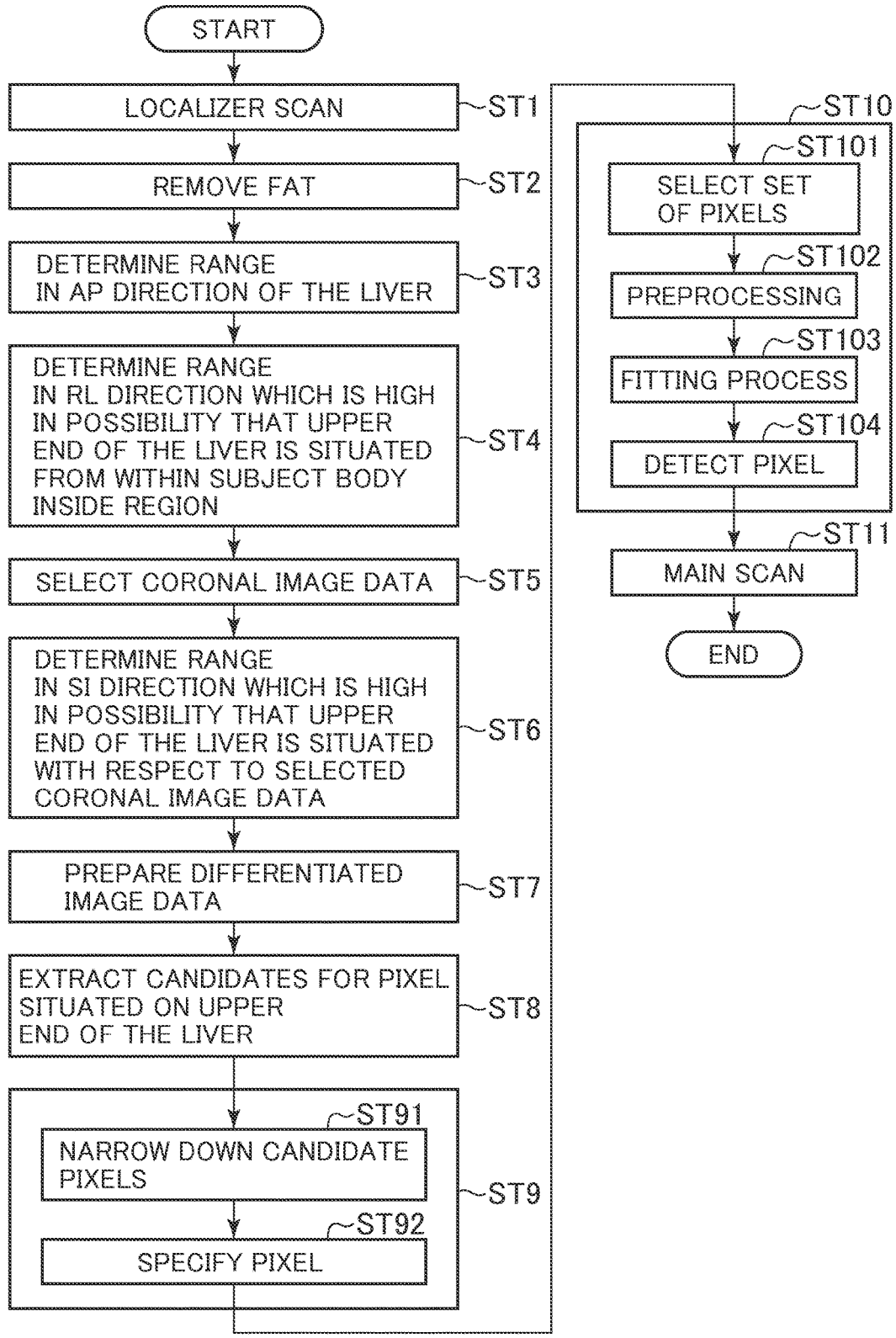
FIG. 4 is a diagram showing a flow when imaging a subject in the first embodiment.

FIG. 4 is a diagram showing the flow when the subject is to be imaged in the first embodiment. In step ST1, the localizer scan LS (see FIG. 2) is executed.

Figure 5:
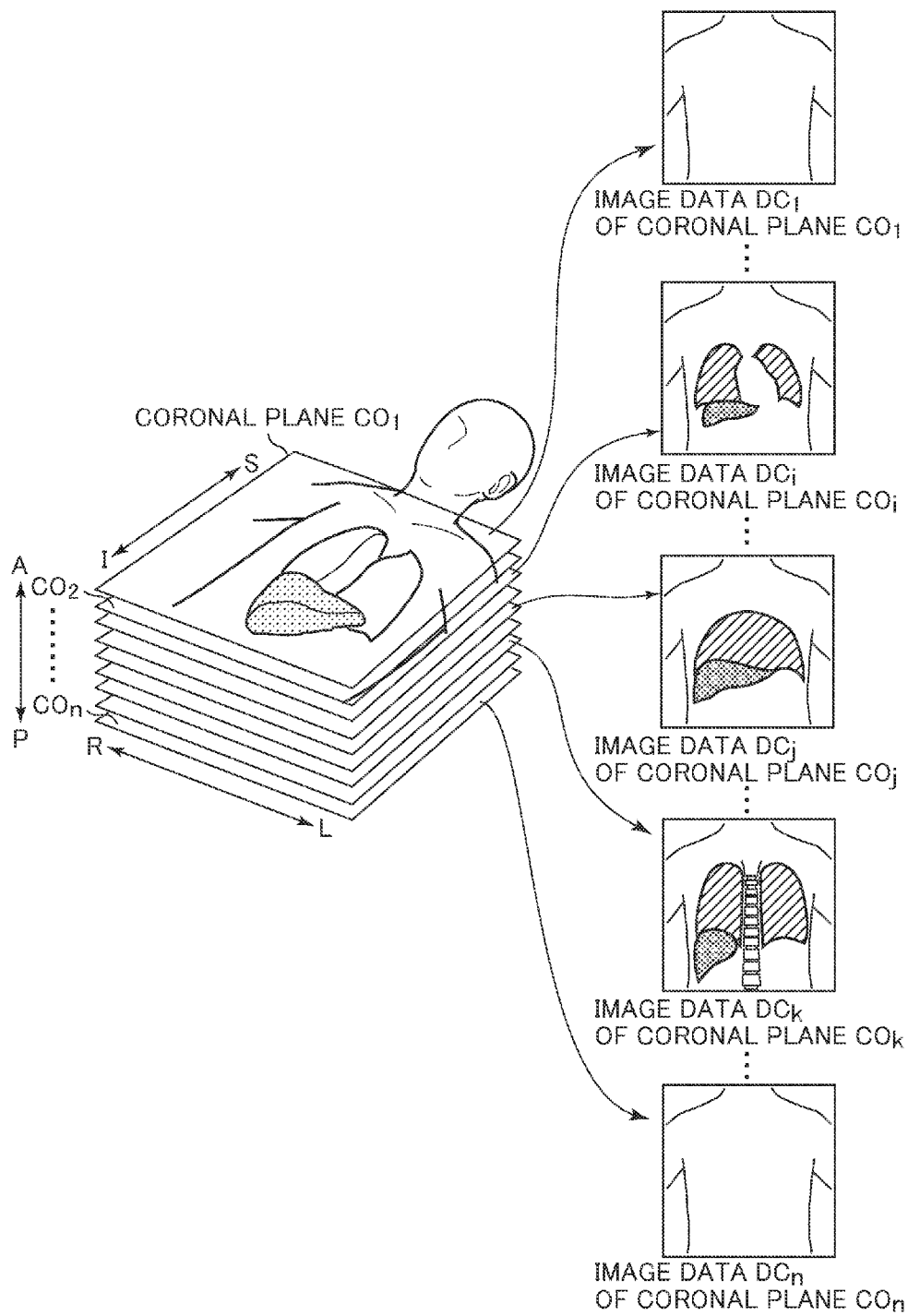
FIG. 5 is an illustration of a localizer scan LS.
Figure 6:
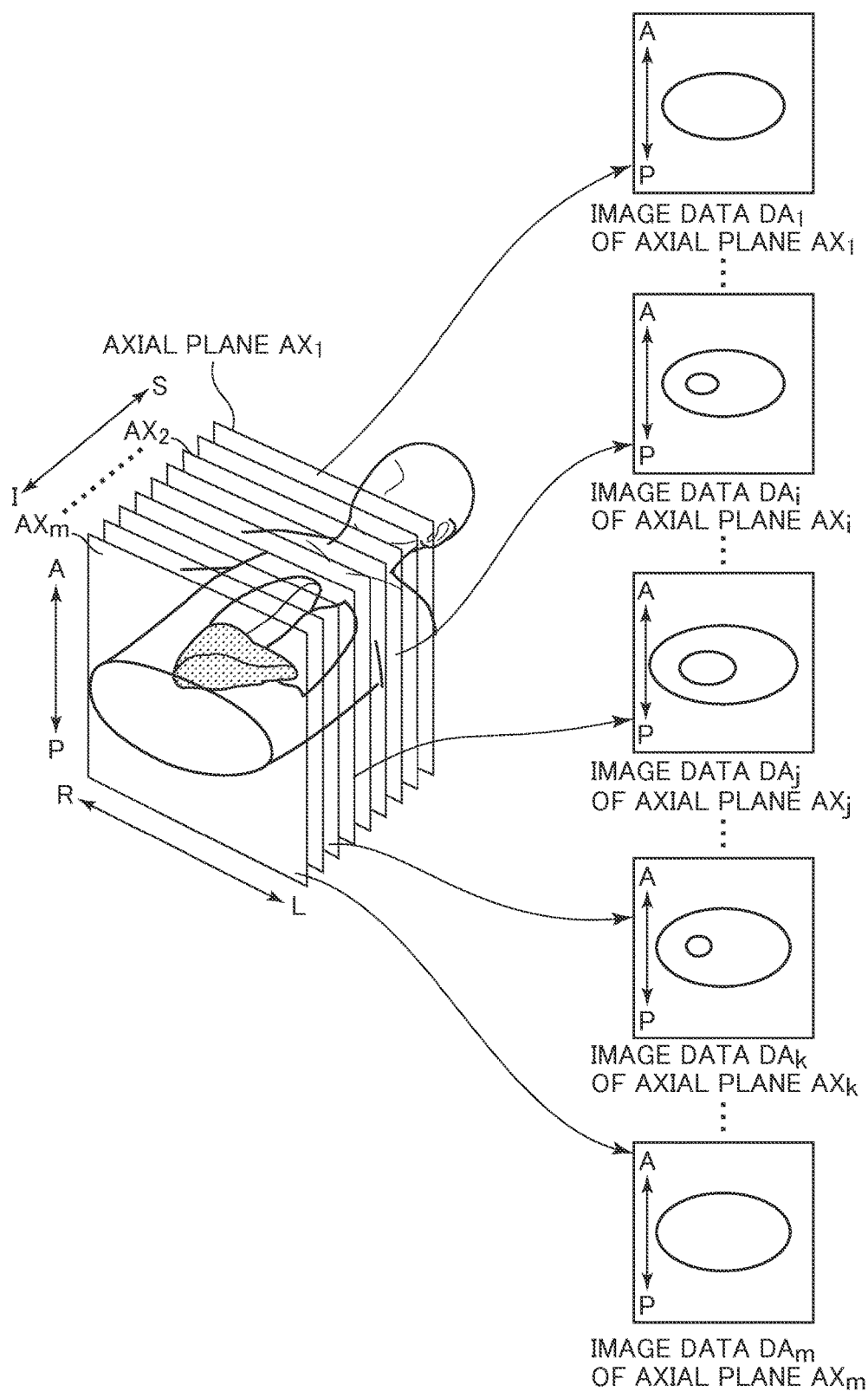
FIG. 6 is an illustration of a localizer scan LS.

FIG. 5 and FIG. 6 are illustrations of the localizer scan LS. In the localizer scan LS, scans (see FIG. 5) of a plurality of coronal planes $CO_1$ to $Co_n$ crossing the imaged part including the liver and scans (see FIG. 6) of a plurality of axial planes $AX_1$ to $AX_m$ crossing the imaged part including the liver are executed. The image data preparation means 81 (see FIG. 1) prepares image data $DC_1$ to $DC_n$ of the coronal planes $CO_1$ to $Co_n$ and image data $DA_1$ to $DA_m$ of the axial planes $AX_1$ to $AX_m$. In the following, the image data of the coronal plane will be referred to as "coronal image data" and the image data of the axial plane will be referred to as "axial image data". After the coronal image data $DC_1$ to $DC_n$ and the axial image data $DA_1$ to $DA_m$ have been prepared, it proceeds to step ST2.

In step ST2, the fat removing means 82 (see FIG. 1) removes the fat from the coronal image data $DC_1$ to $DC_n$ and the axial image data $DA_1$ to $DA_m$. Since the fat exhibits a high signal, the fat can be removed by setting in advance a threshold value for removing the fat and detecting a pixel whose pixel value is larger than the threshold value. After the fat has been removed, it proceeds to step ST3.

In step ST3, the AP range determination means 83 (see FIG. 1) determines the range in the AP direction of the liver of the subject on the basis of the axial image data $DA_1$ to $DA_m$ (see FIG. 6).

Figure 7:
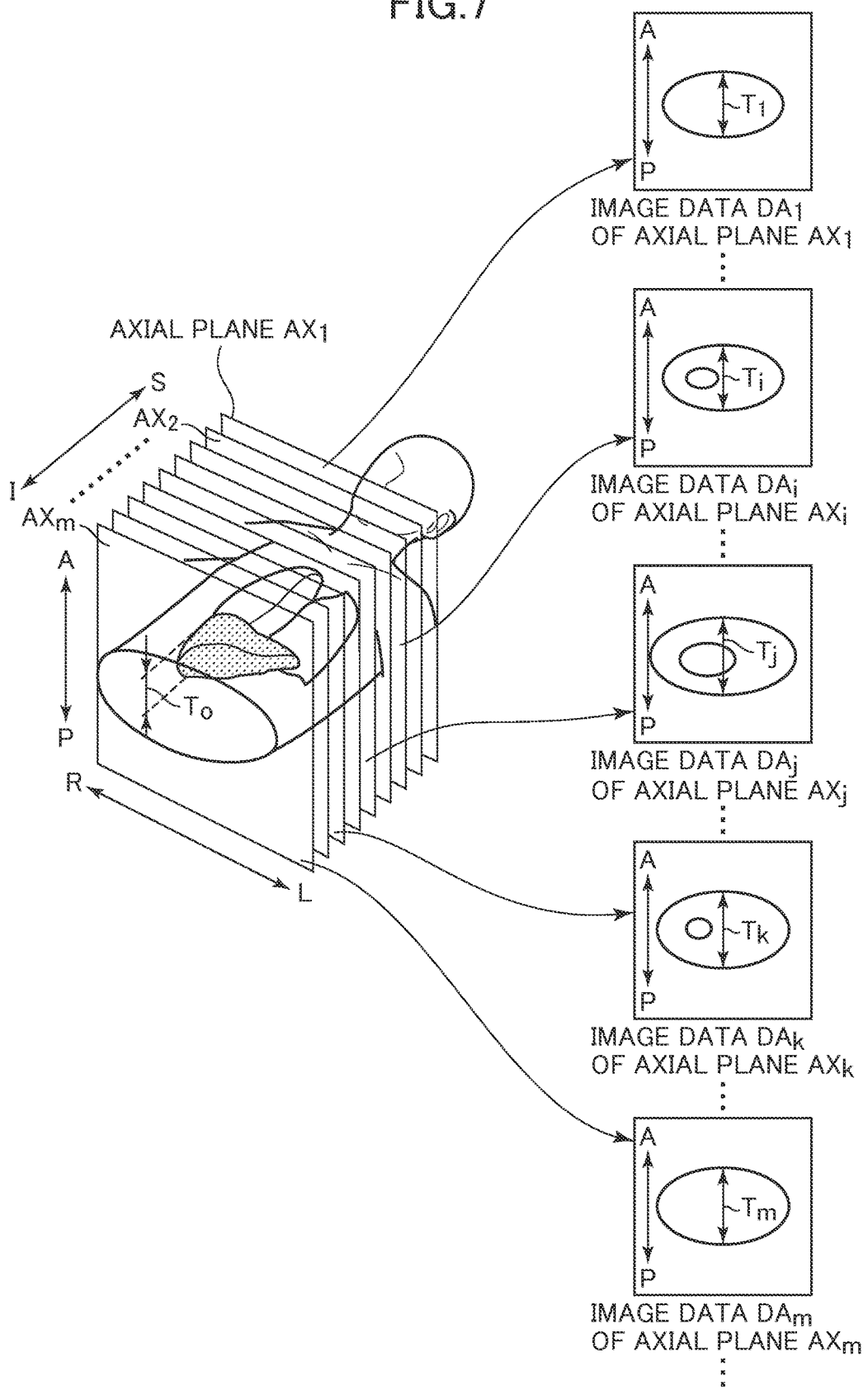
FIG. 7 is an illustration when determining a range in an AP direction of the liver of the subject.

FIG. 7 is an illustration when detecting the range in the AP direction of the liver of the subject. The AP range determination means 33, first, obtains ranges $T_1$ to $T_m$ in the AP direction of a body inside region of the subject for each of the axial planes $AX_1$ to $AX_m$. While a body outside region of the subject exhibits a low signal, the body inside region of the subject exhibits a high signal and therefore the ranges $T_1$ to $T_m$ in the AP direction of the body inside region of the subject can be obtained for each of the axial planes $AX_1$ to $AX_m$ from a difference in signal value.

Next, the AP range determination means 83 determines a range To in the AP direction of the liver on the basis of these ranges $T_1$ to $T_m$. Since the position in the AP direction of the liver relative to the body inside region of the subject is roughly fixed, the range, To in the AP direction of the liver can be determined from information on the ranges $T_1$ to $T_m$. As one example of this determination method, there exists a method of selecting one range $T_j$ form within the ranges $T_1$ to $T_m$ and determining a central part of the range $T_j$ as the range To in the AP direction of the liver. After the range To in the AP direction of the liver has been determined, it proceeds to step ST4.

In step ST4, the RL range determination means 84 (see FIG. 1) determines a range in the RL direction which is high in possibility that the upper end of the liver is situated from within the inside body region of the subject on the basis of the axial image data $DA_1$ to $DA_m$ (see FIG. 6).

Figure 8:
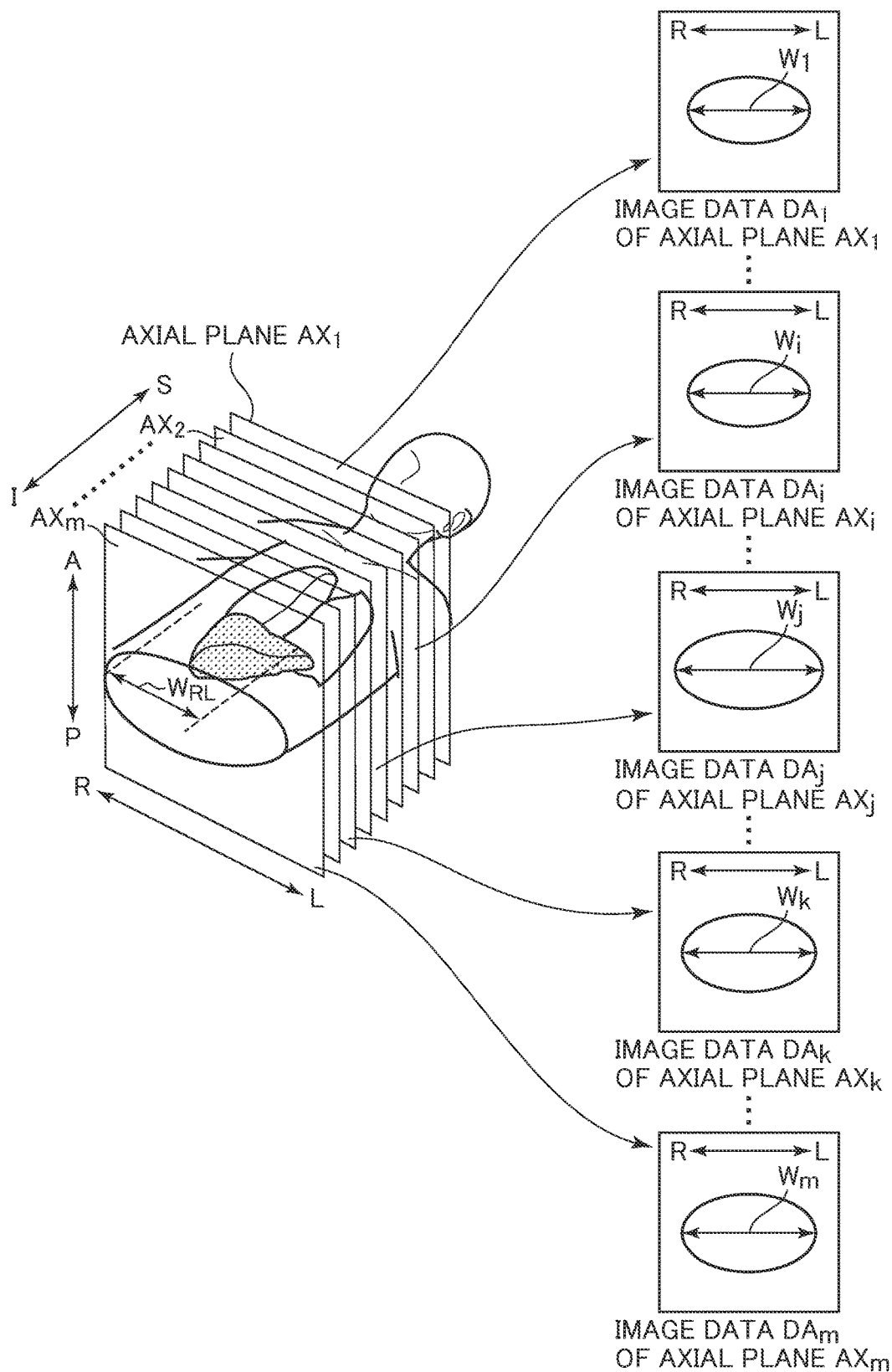
FIG. 8 is an illustration when determining a range in an RL direction which is high in possibility that an upper end of the liver is situated, in a body inside region of the subject.

FIG. 8 is an illustration when detecting the range in the RL direction which is high in possibility that the upper end of the liver is situated in the body inside region of the subject.

The RL range determination means 84, first, obtains ranges $W_1$ to $W_m$ in the RL direction of the body inside region of the subject on the respective axial planes $AX_1$ to $AX_m$. While the body outside region of the subject exhibits the low signal, the body inside region of the subject exhibits the high signal and therefore the ranges $W_1$ to $W_m$ in the RL direction of the body inside region of the subject can be obtained for each of the axial planes $AX_1$ to $AX_m$ from a difference in signal value. The RL range determination means 84 determines a range $W_{RL}$ in the RL direction which is high in possibility that the upper end of the liver is situated on the basis of these ranges $W_1$ to $W_m$. Since, in general, the upper end of the liver is situated on the right-half side of the subject, the range $W_{RL}$ in the RL direction which is high in possibility that the upper end of the liver is situated can be obtained from information on the ranges $W_1$ to $W_m$. After the range $W_{RL}$ in the RL direction which is high in possibility that the upper end of the liver is situated has been determined, it proceeds to step ST5.

Figure 9:
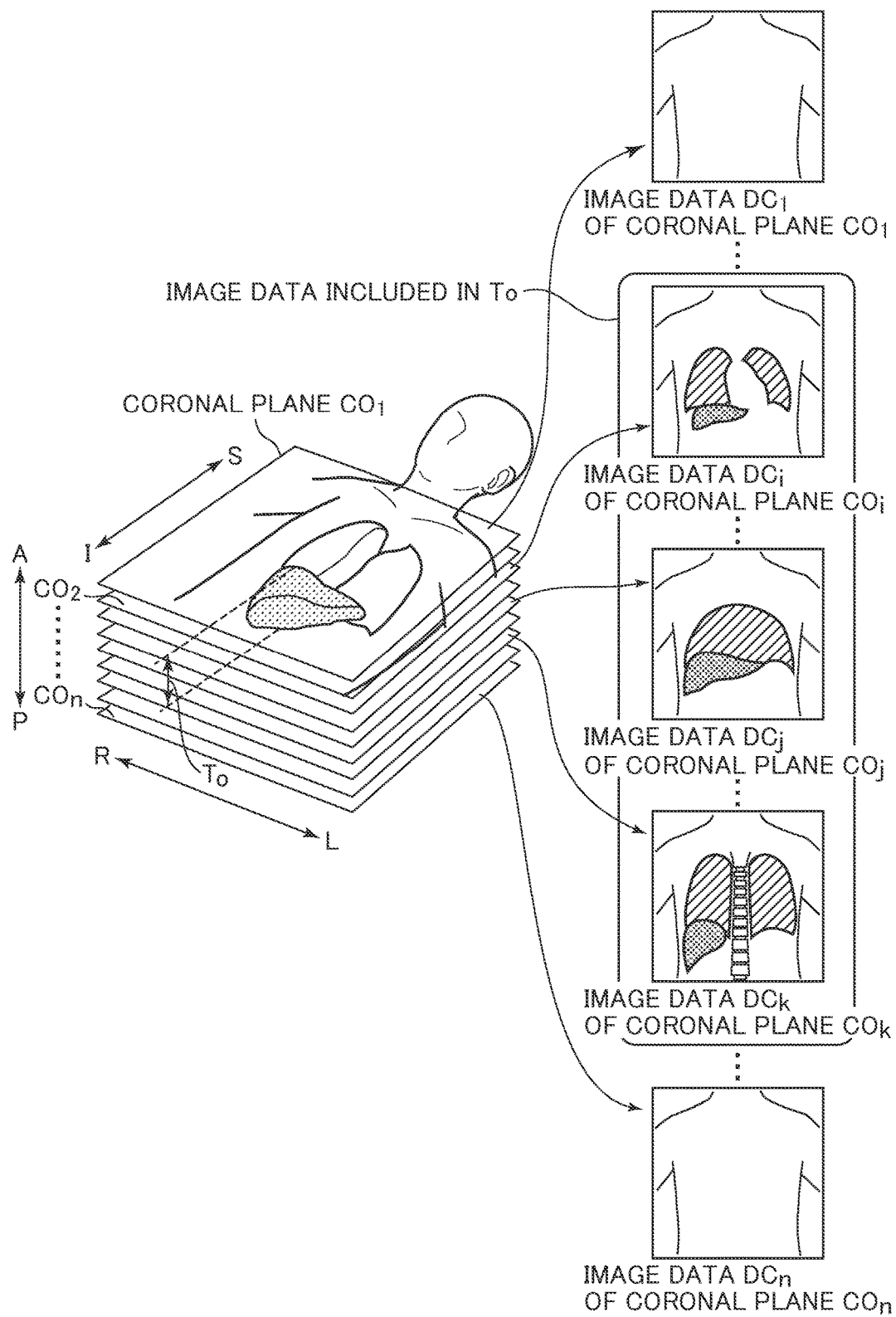
FIG. 9 is a diagram showing coronal image data included in a region $T_O$ in the AP direction of the liver.

In step ST5, coronal image data included in the range To in the AP direction of the liver is selected in the coronal image data $DC_1$ to $DC_n$. The coronal image data included in the range To in the AP direction of the liver are shown in FIG. 9. In the present embodiment, it is assumed that the coronal image data $DC_i$ to $DC_k$ are included in the range To in the AP direction of the liver. After the coronal image data $DC_i$ to $DC_k$ included in the range To in the AP direction of the liver have been selected, it proceeds to step ST6.

Figure 10:
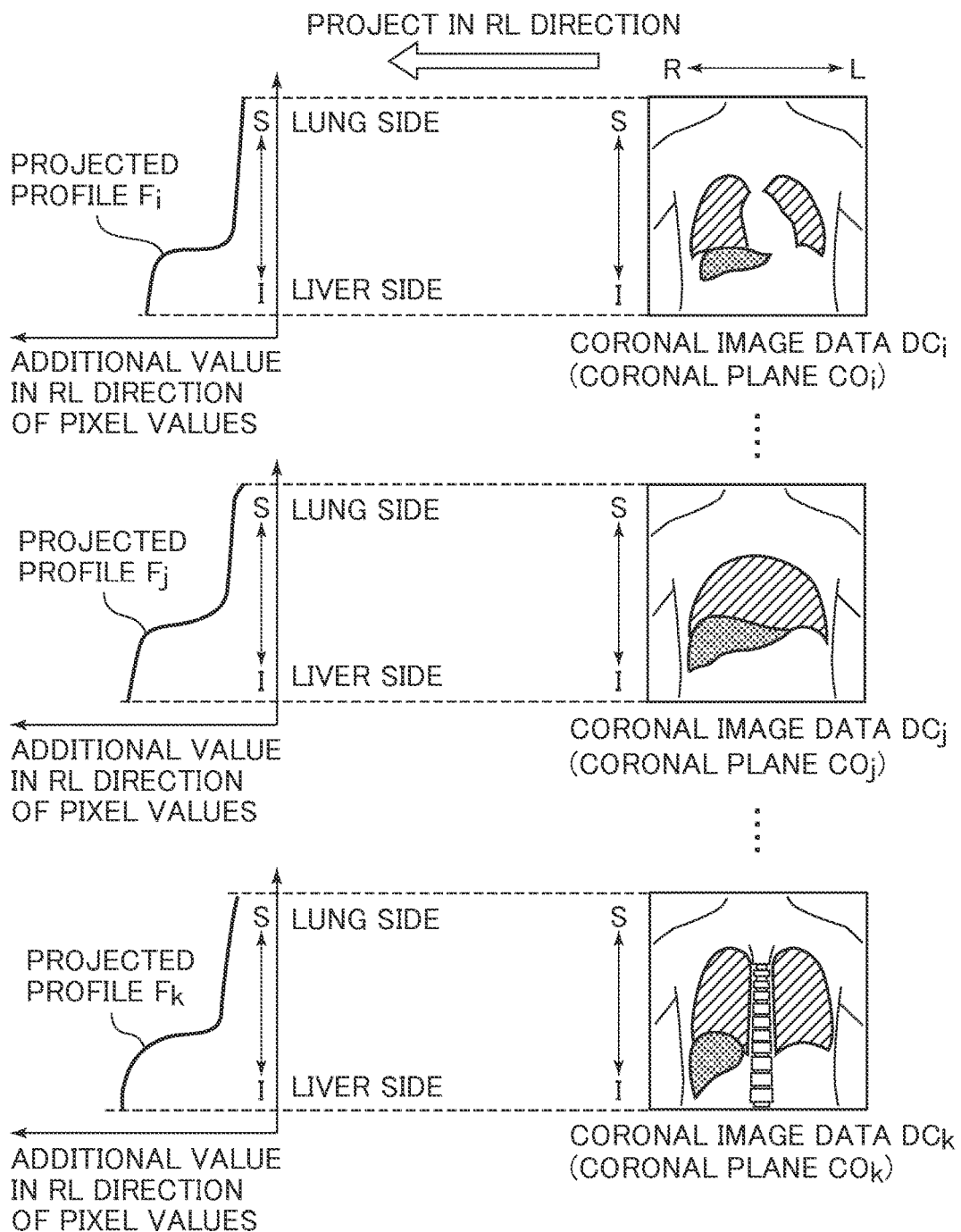
FIG. 10 is a diagram schematically showing projected profiles $F_i$ to $F_k$ which have been respectively prepared for image data $DC_i$ to $DC_k$.

In step ST6, the SI range determination means 85 (see FIG. 1) determines a range in the SI direction which is high in possibility that the boundary between the lung and the liver is situated for each piece of the coronal image data $DC_i$ to $DC_k$ selected in step ST5. This range is determined as follows. The SI range determination means 85, first, prepares projected profiles obtained by adding pixels values in the RL direction for the coronal image data $DC_i$ to $DC_k$. Projected profiles $F_i$ to $F_k$ which have been prepared for each piece of the image data $DC_i$ to $DC_k$ are schematically shown in FIG. 10. While the liver exhibits a high signal, the lung exhibits a low signal and therefore if projected profiles of the coronal image data crossing the lung and the liver are prepared, an additional value will get smaller on the lung side and an additional value will get larger on the liver side. Due to a difference between the additional values as mentioned above, level differences in additional value appear in the projected profiles $F_i$ to $F_k$ in the SI direction. Therefore, it becomes possible to obtain the range in the SI direction which is high in possibility that the boundary between the lung and the liver is situated by detecting the positions of the level differences appearing in the projected profiles $F_i$ to $F_k$. Next, a method of detecting the positions of the level differences appearing in the projected profiles $F_i$ to $F_k$ will be described. Incidentally, since the method of detecting the position of the level difference is the same on any of the projected profiles, in the following, a method of detecting the position of the level difference appearing on a projected profile $F_j$ will be described by taking up the projected profile $F_j$ from within the projected profiles $F_i$ to $F_k$.

Figure 11:
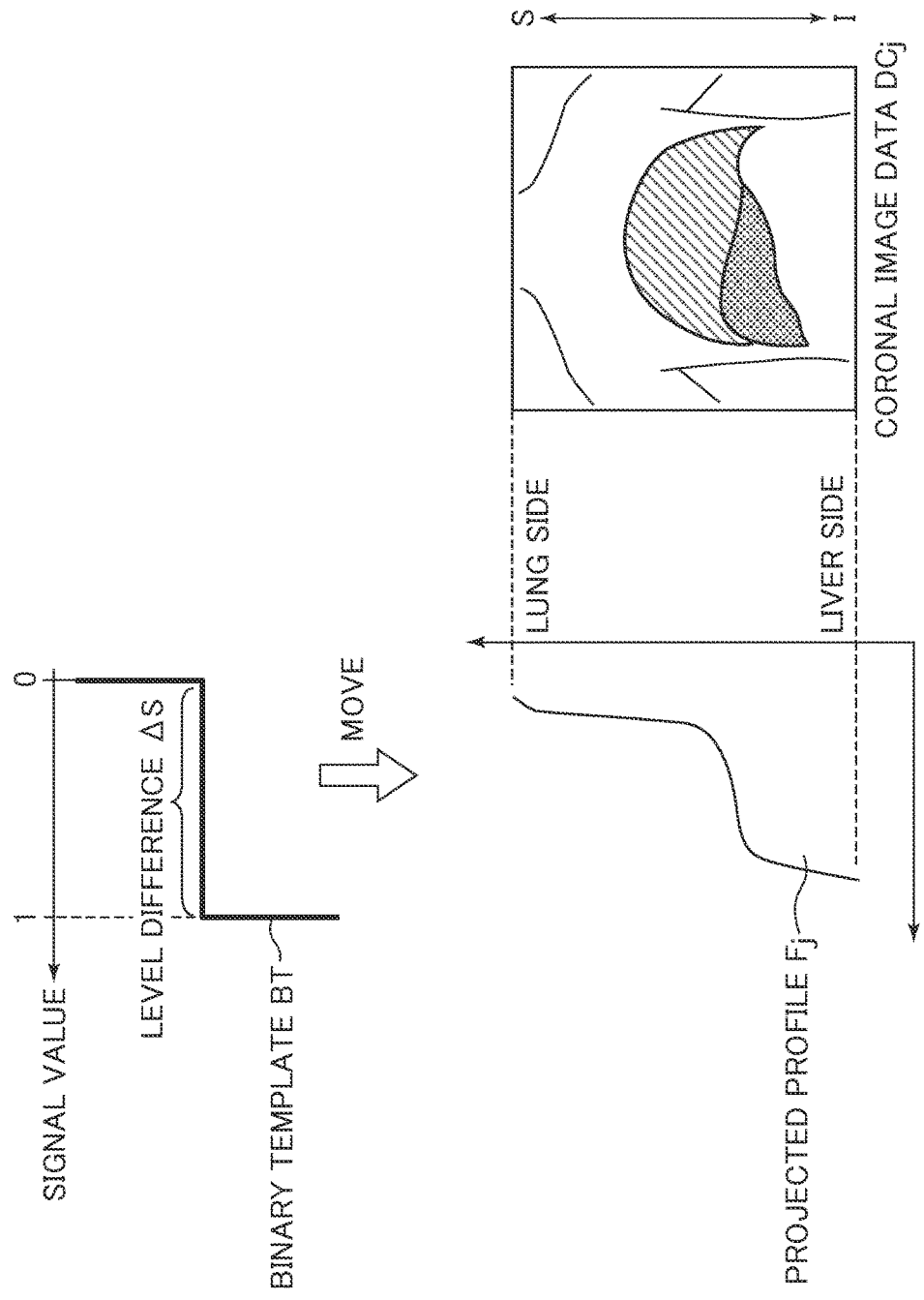
FIG. 11 is an illustration of a method of detecting the position of a level difference appearing in the projected profile $F_i$.
Figure 12:
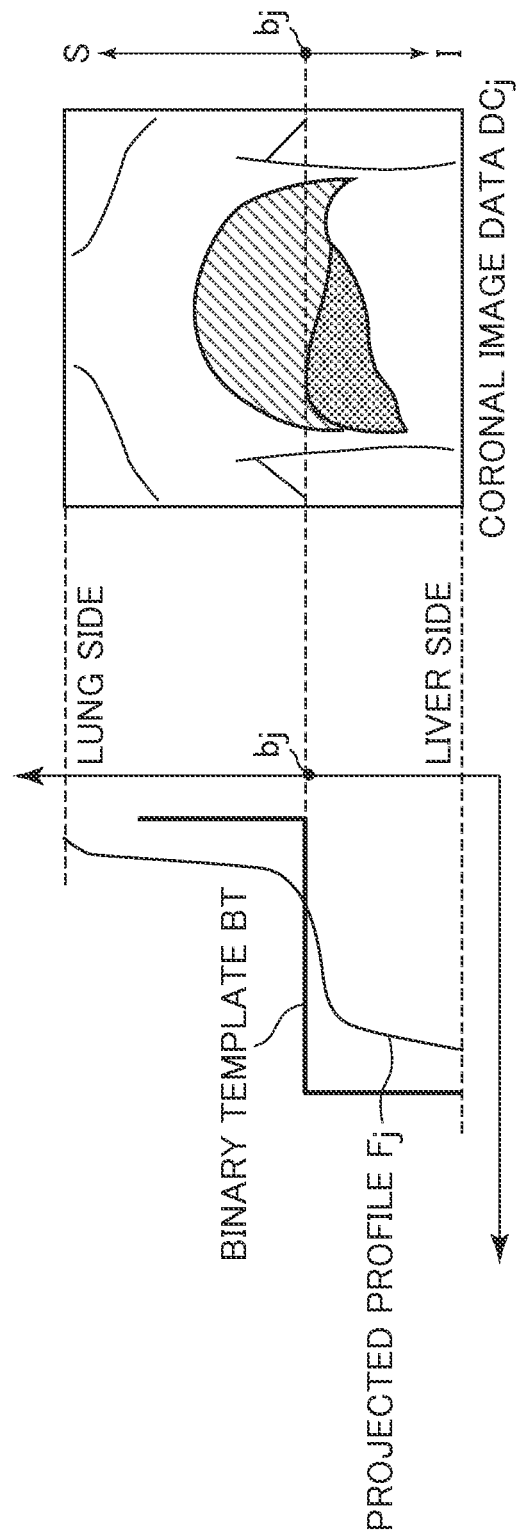
FIG. 12 is a diagram schematically showing the position of a binary template BT when a correlation is maximized relative to a projected profile $F_j$.

FIG. 11 is an illustration of the method of detecting the position of the level difference appearing on the projected profile $F_j$. In the present embodiment, the level difference on the projected profile $F_j$ is detected by using a binary template BT. The binary template is a template having a level difference $\Delta s$ of a signal value by a value "1" and a value "0". In a case where the level difference on the projected profile $F_j$ is to be detected, the binary template BT is moved from the lung side toward the liver side of the projected profile $F_j$ little by little and a correlation between the binary template and the projected profile $F_j$ is calculated every time the binary template BT is moved. Since the binary template BT has the level difference $\Delta s$, the position of the level difference appearing on the projected profile $F_j$ can be detected by specifying the position of the template BT where the correlation is maximized. The position of the binary template BT when the correlation is maximized relative to the projected profile $F_j$ is schematically shown in FIG. 12. In FIG. 12, the correlation between the projected profile $F_j$ and the binary template BT is maximized when the binary template BT has reached a position $b_j$. Therefore, it is found that the upper end of the liver in the coronal image data $DC_j$ is present around the position $b_j$ with respect to the SI direction.

Figure 13:
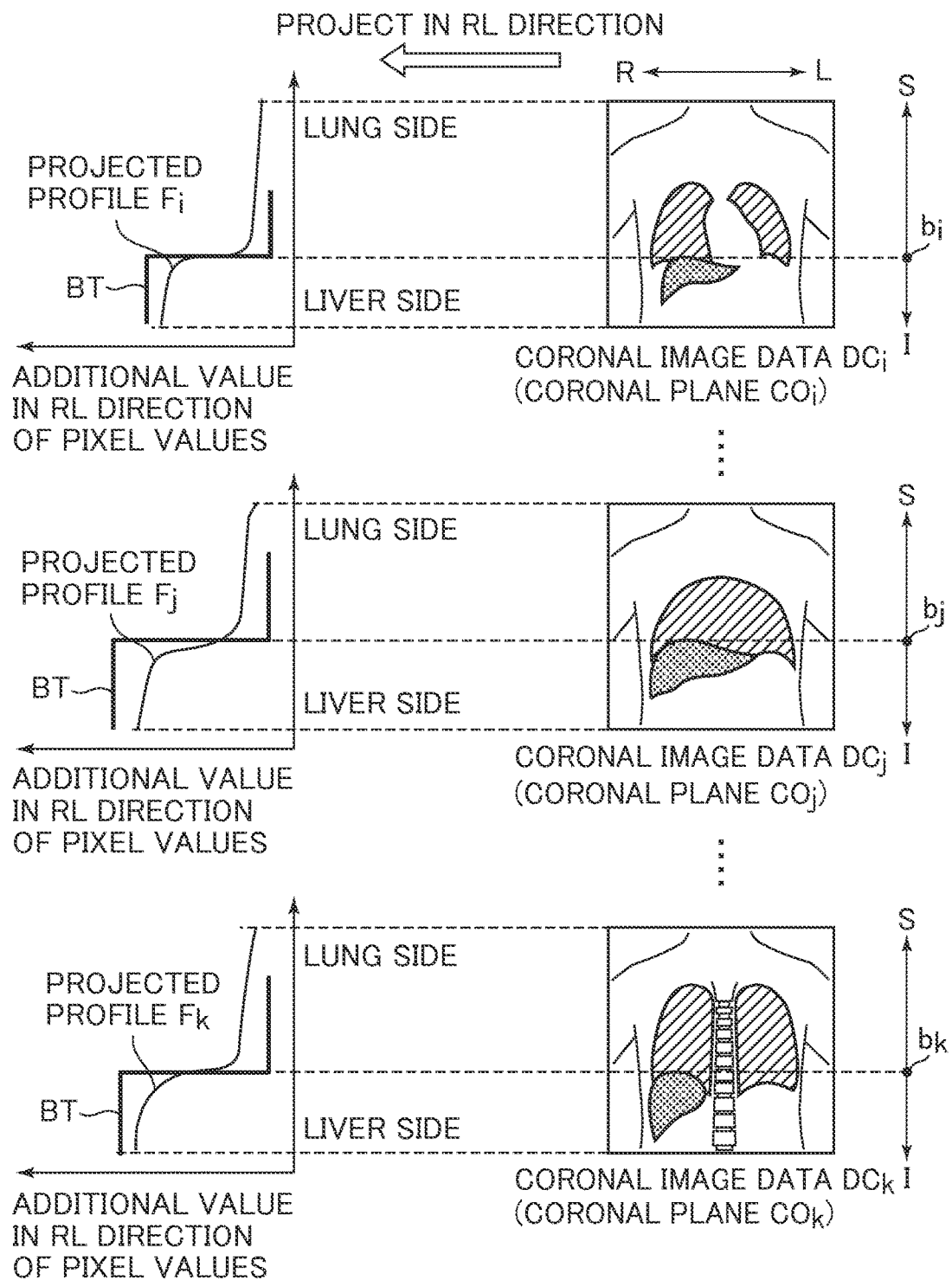
FIG. 13 is a diagram schematically showing positions $b_i$ to $b_k$ of level differences of the projected profiles $F_i$ to $F_k$ detected by the binary template BT.

Incidentally, although in FIG. 11 and FIG. 12, the method of detecting the position of the level difference on the projected profile Fj has been described, the positions of the level differences also on other projected profiles can be detected by calculating the correlation with the binary template BT and specifying the position of the binary template BT where the correlation is maximized. The positions $b_i$ to $b_k$ of the level differences on the projected profiles $F_i$ to $F_k$ detected by the binary template BT are schematically shown in FIG. 13. After the positions $b_i$ to $b_k$ of the level differences on the respective projected profiles $F_i$ to $F_k$ have been detected, the range in the SI direction which is high in possibility that the boundary between the lung and the liver is situated is determined on the basis of the detected positions $b_i$ to $b_k$ of the level differences (see FIG. 14).

Figure 14:
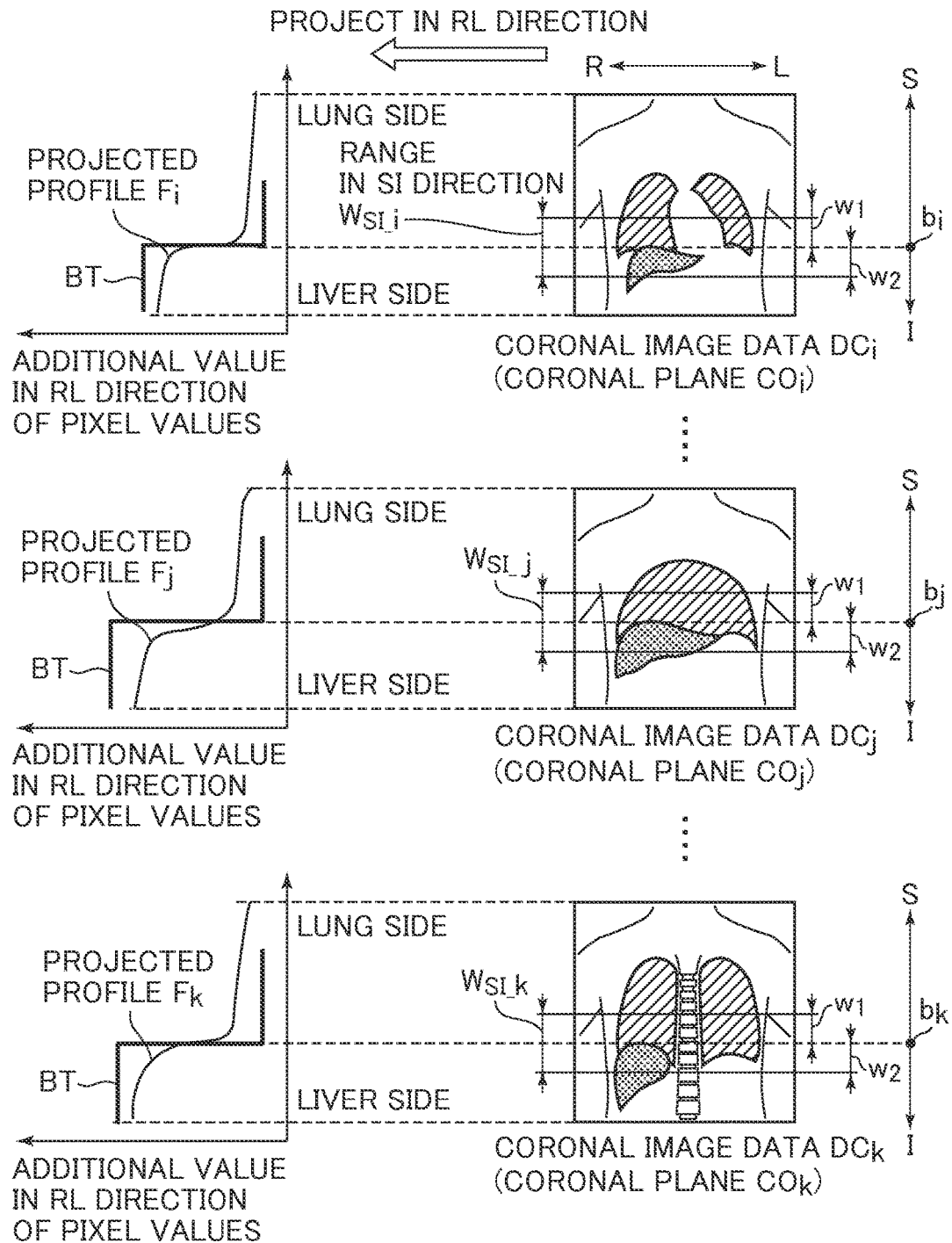
FIG. 14 is a diagram schematically showing ranges in an SI direction which are high in possibility that the boundary between the lung and the liver is situated.

FIG. 14 is a diagram schematically showing the range in the SI direction which is high in possibility that the boundary between the lung and the liver is situated. The SI range determination means 85 defines a range of a width w1 on the lung side and defines a range of a width w2 on the liver side on the basis of the detected positions $b_i$ to $b_k$ of the level differences. The ranges defined for each of the coronal image data $DC_i$ to $DC_k$ in the above mentioned manner are determined as ranges $W_{SI\_i}$ to $W_{SI\_k}$ in the IS direction which are high in possibility that the boundary between the lung and the liver is situated. The widths w1 and w2 have values which have been set in advance before imaging the subject, and can be set to, for example, several cm. After the ranges $W_{SI\_i}$ to $W_{SI\_k}$ in the IS direction which are high in possibility that the boundary between the lung and the liver is situated have been determined for each of the coronal image data $DC_i$ to $DC_k$, it proceeds to step ST7.

Figure 15:
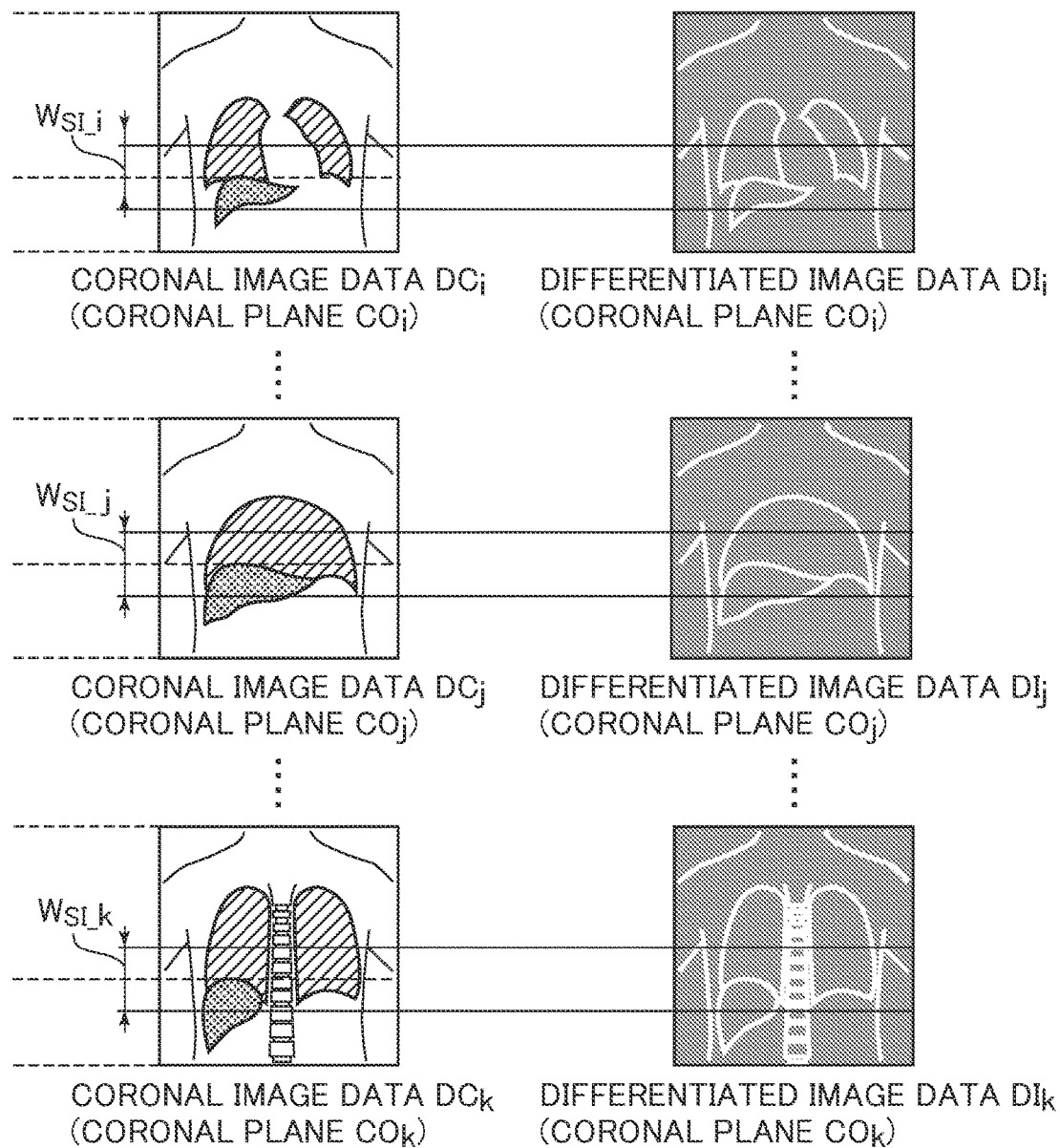
FIG. 15 is a diagram schematically showing differentiated image data $DI_i$ to $M_k$.

In step ST7, differentiated image data are prepared by differentiating the coronal image data $DC_i$ to $DC_k$. The differentiated image data $DI_i$ to $DI_k$ are schematically shown in FIG. 15. Incidentally, although a positive value and a negative value are present in a differential value, the differentiated image data $DI_i$ to $DI_k$ when the differential value is expressed by an absolute value are shown in FIG. 15 for the convenience of explanation.

In the coronal image data $DC_i$ to $DC_k$, a difference between the pixel value of the pixel of the liver and the pixel value of the pixel of the lung is large. Therefore, the differential value of the pixel which is situated on the boundary between the lung and the liver is increased when the coronal image data $DC_i$ to $DC_k$ are differentiated. On the other hand, the differential value of the pixel within the liver and the differential value of the pixel within the lung are reduced. Therefore, it becomes possible to emphatically depict the pixel which is situated on the boundary between the lung and the liver by preparing the differentiated image data $DI_i$ to $DI_k$. In the differentiated image data $DI_i$ to $DI_k$ in FIG. 15, it is shown that the differential value of a white part is large and the differential value of a black part is small. After the differentiated image data $DI_i$ to $DI_k$ of the coronal planes $CO_i$ to $CO_k$ have been prepared, it proceeds to step ST8.

In step ST8, the pixel extraction means 86 (see FIG. 1) extracts the candidates for the pixel which is situated on the boundary between the lung and the liver on each of the coronal planes $CO_i$ to $CO_k$ on the basis of the differentiated image data $DI_i$ to $DI_k$. In the following, a method of extracting the candidates for the pixel which is situated on the upper end of the lung will be described. Incidentally, since this extraction method is the same on any coronal place, in the following, a method of extracting the candidates for the pixel which is situated on the boundary between the lung and the liver from a coronal plane $CO_j$ will be described by taking up the coronal plane $CO_j$ from within the coronal planes $CO_i$ to $CO_k$.

Figure 16:
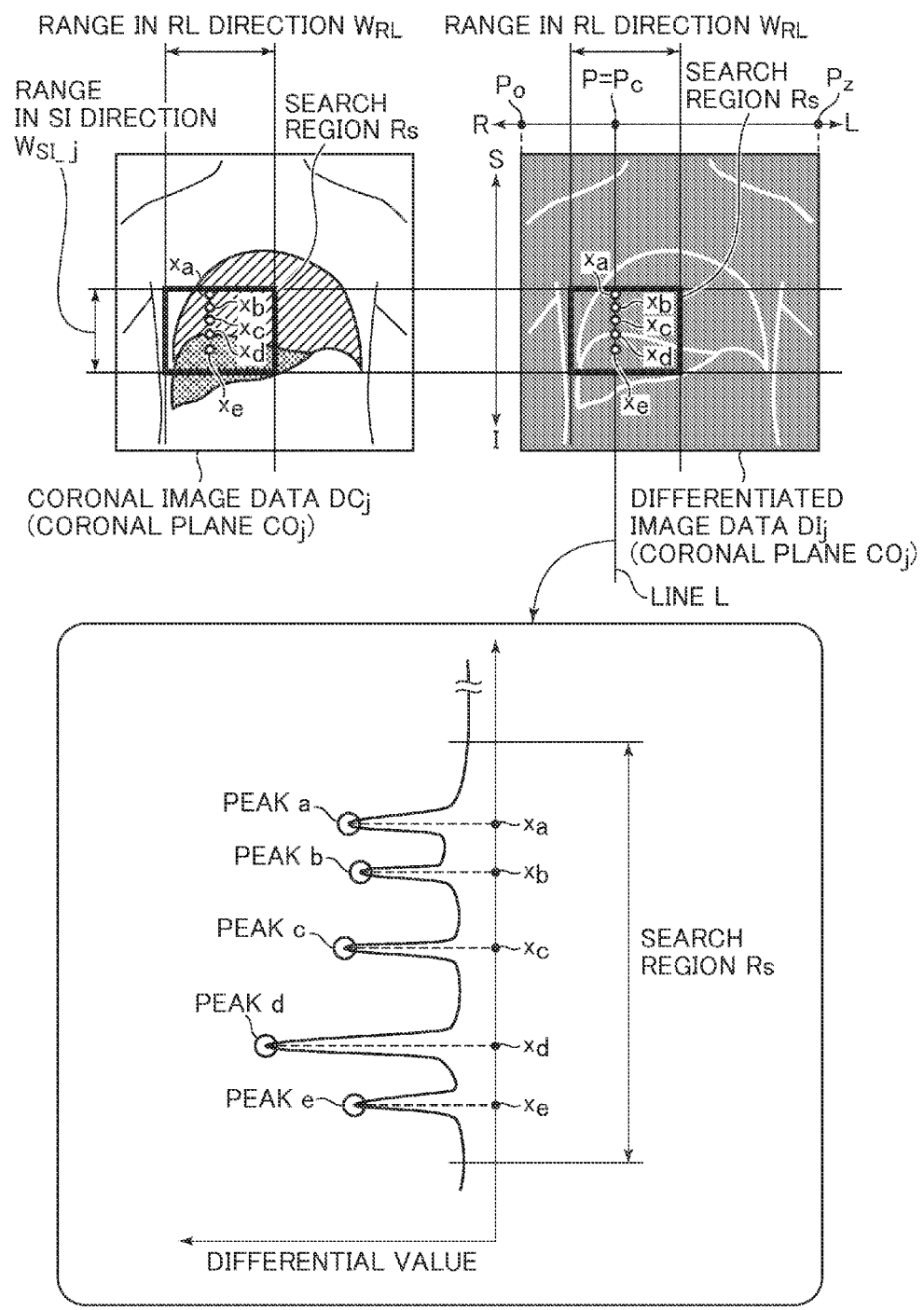
FIG. 16 is an illustration of a method of extracting candidates for a pixel which is situated on the boundary between the lung and the liver from within a coronal plane $CO_j$.

FIG. 16 is an illustration of the method of extracting the candidates for the pixel which is situated on the boundary between the lung and the liver from within the coronal plane $CO_j$. The pixel extraction means 86, first, sets a region (hereinafter, referred to as a "search region") Rs where search for the pixel is performed on the differentiated image data $DI_j$. The search region Rs is set as a region where the range $W_{RL}$ (see FIG. 8) in the RL direction obtained in step ST4 is superimposed on the range $W_{SI\_j}$ in the SI direction obtained in step ST6.

Next, the pixel extraction means 86 thinks a line L in the SI direction crossing the search region Rs on the differentiated image data $DI_j$ and obtains a profile of differential values of pixels on the line L. In FIG. 16, the profile of the differential values on the line L of a coordinate value in the PL direction P=Pc is shown. Incidentally, although there exist a positive value and a negative value in the differential value in reality, only the positive differential value will be thought of for the convenience of explanation in FIG. 16.

As described above, the differential value of the pixel which is situated on the boundary between the lung and the liver is increased. Therefore, the candidates for the pixel which is situated on the boundary between the lung and the liver can be extracted by detecting a peak appearing in the search region Rs of the profile. In FIG. 16, five peaks a to e appear on the profile of the differential values. Therefore, pixels $x_a$ to $x_e$ corresponding to the peaks a to e will be the candidates (hereinafter, referred to as "candidate pixels") for the pixel which is situated on the boundary between the lung and the liver.

Although, in the above mentioned description, the method of extracting the candidate pixels on the line L of the coordinate value P=Pc has been described, the candidate pixels can be also extracted by the same method even when the line L has a coordinate value other than Pc. Therefore, it becomes possible to extract the candidates for the pixel which is situated on the boundary between the lung and the liver from within the search region Rs by changing the coordinate value P in the RL direction of the line L in the search region Rs, obtaining the profile of the differential values on the line L of each coordinate value P and detecting peaks per profile.

In addition, although in FIG. 16, a case of extracting the candidate pixels from the coronal plane $CO_j$ is described, they can be extracted by the same method also in case of extraction of the coordinate pixels from another coronal plane. Therefore, the candidates for the pixel which is situated on the boundary between the lung and the liver can be extracted on each of the coronal planes $CO_i$ to $CO_k$. After the candidate pixels have been extracted, it proceeds to step ST9.

In step ST9, the pixel specification means 87 (see FIG. 1) specifies the pixel situated on the boundary between the lung and the liver from within the extracted candidate pixels. In the following, a method of specifying the pixel situated on the boundary between the lung and the liver will be described. Since step ST9 has two steps ST91 and ST92, they will be described in order in the following.

In step ST91, the pixel narrowing-down means 87a (see FIG. 1) narrows down the pixels which are high in possibility that they are situated on the boundary between the lung and the liver from within the extracted candidate pixels. For example, referring to FIG. 16, five candidate pixels $x_a$ to $x_e$ are extracted on the line L of the coordinate value P=Pc. In the candidate pixels $X_a$ to $X_e$, the pixel situated on the boundary between the lung and the liver is the candidate pixel $x_d$ and the remaining candidate pixels $x_a$, $x_b$, $x_c$ and $x_e$ are not situated on the boundary between the lung and the liver. Thus, in the present embodiment, the pixels which are high in possibility that they are situated on the boundary between the lung and the liver are narrowed down from within the extracted candidate pixels $x_a$ to $x_e$. In the following, a method of narrowing down the pixels will be described.

Figure 17:
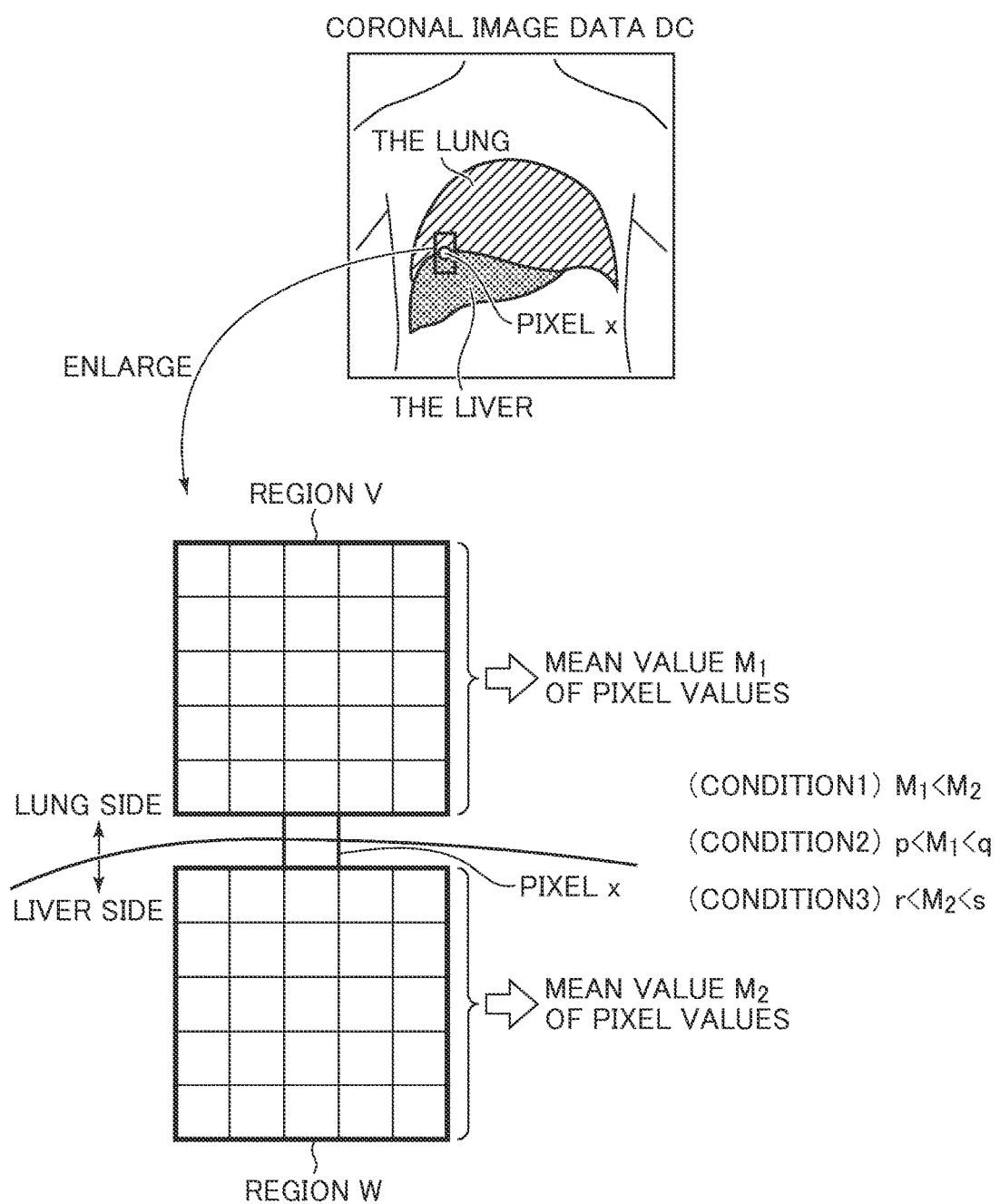
FIG. 17 is an illustration of one example of a method of narrowing down pixels which are high in possibility that they are situated on the boundary between the lung and the liver from within the extracted candidate pixels.

FIG. 17 is an illustration of one example of the method of narrowing down the pixels situated on the boundary between the lung and the liver from within the extracted candidate pixels. First, the pixel situated on the boundary between the lung and the liver is thought of in the coronal image data DC. Here, the pixel situated on the boundary between the lung and the liver is designated by a symbol "x".

Next, a region V is set on the lung side and a region W is set on the liver side for the pixel x. The size of the regions V and W is a pixel size of n×m. In FIG. 17, an example of a pixel size of 5×5 is shown. Then, a mean value M1 of pixel values of pixels included in the region V and a mean value M2 of pixel values of pixels included in the region W are obtained.

In general, there is a tendency that the pixel value of the pixel in the region of the lung is reduced, while the pixel value of the pixel in the region of the liver is increased. Therefore, it is thought that the following relationship is established when comparing the mean value M1 of the pixel values in the region V with the mean value M2 of the pixel values in the region W, M1<M2.

In addition, the region V is situated on the lung side. Since there is a tendency that the pixel value of the pixel included in the lung is reduced, a value that the mean value M1 of the pixels values in the region V could take can be narrowed down to a certain extent. Specifically, it is thought that the mean value M1 of the pixel values is high in possibility that it is included in a range expressed by the following formula: P<M1<q. Here, p: a lower limit value of values allowable as the mean value M1 q: an upper limit value of values allowable as the mean value M1

The lower limit value p and the upper limit value q are values which are determined with reference to, for example, pixel values of the lungs of image data acquired by actually scanning a plurality of human beings.

Further, the region W is situated on the liver side. Since there is a tendency that the pixel value of the pixel included in the liver is increased, a value that the mean value M2 of the pixels values in the region W could take can be narrowed down to a certain extent. Specifically, it is thought that the mean value M2 of the pixel values is high in possibility that it is included in a range expressed by the following formula: r<M2<s. Here, r: a lower limit value of values allowable as the mean value M2 $s$: an upper limit value of values allowable as the mean value M2

The lower limit value r and the upper limit value s are values which are determined with reference to, for example, pixel values of the livers of image data acquired by actually scanning a plurality of human beings.

That is, in a case where the pixel x is situated on the boundary between the lung and the liver, it is thought that the mean value M1 of the pixel values in the region V and the mean value M2 of the pixel values in the region W satisfy the following conditions. (Condition 1) M1<M2 (Condition 2) p<M1<q (Condition 3) r<M2<s Therefore, if a pixel which satisfies all of the three conditions 1 to 3 could be found, the pixels which are high in possibility that they are situated on the boundary between the lung and the liver can be narrowed down from within the extracted candidate pixels. Thus, in the present embodiment, the regions V and W are set for each of the candidate pixels $x_a$ to $x_e$ and whether they satisfy the three conditions 1 to 3 is decided (see FIG. 18).

Figure 18:
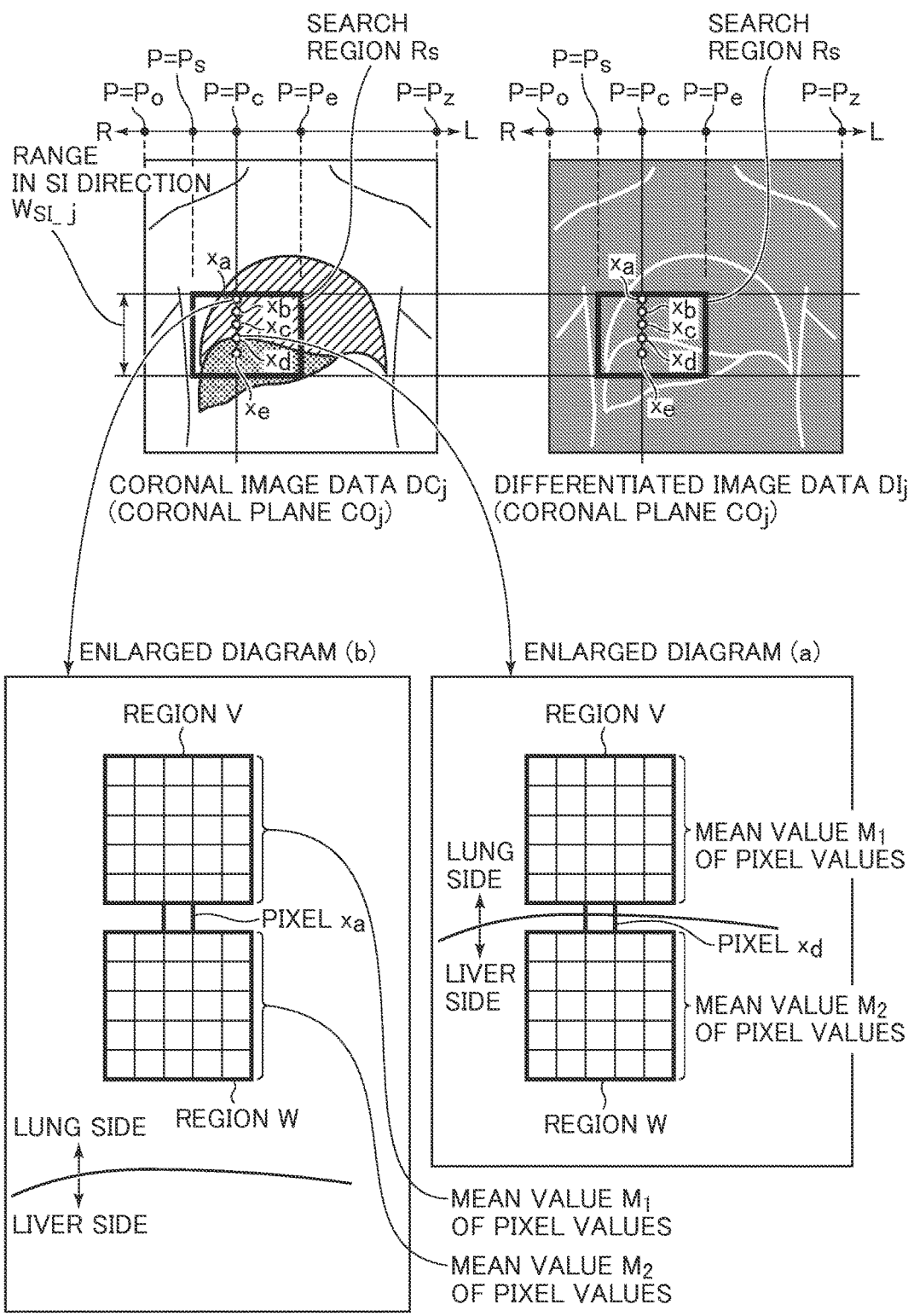
FIG. 18 is an illustration when setting regions V and W with respect to each of candidate pixels $X_a$ to $X_e$ and deciding whether they satisfy three conditions 1 to 3.

FIG. 18 is an illustration when setting the regions V and W for each of the candidate pixels $x_a$ to $x_e$ and deciding whether they satisfy the three conditions 1 to 3. Incidentally, since this deciding method is the same for any candidate pixel, description will be made by representatively taking up two candidate pixels $x_a$ and $x_d$ from within the candidate pixels $x_a$ to $x_e$ in FIG. 18.

The pixel narrowing-down means 87a, first, detects the positions of the candidate pixels $x_a$ and $x_d$ on the coronal image data $DC_i$. Then, it sets the regions V and W for each of the candidate pixels $x_a$ and $x_d$ and calculates the means values M1 and M2 of the pixel values.

In a case where the regions V and W have been set for the candidate pixel $x_d$ (see an enlarged diagram (a)), the region V is situated on the lung side and the region W is situated on the liver side. Therefore, in case of the candidate pixel $x_d$, it is thought that the mean values M1 and M2 of the pixel values satisfy all of the three conditions 1 to 3.

However, in a case where the regions V and W have been set for the candidate pixel $x_a$ (see an enlarged diagram (b)), since not only the region V but also the region W are situated on the lung side, it is thought that they do not satisfy the condition 3.

Therefore, the pixels which are high in possibility that they are situated on the boundary between the lung and the liver can be narrowed down from within the extracted candidates $x_a$ to $x_e$ by specifying the candidate pixels satisfying the three conditions 1 to 3. Here, it is assumed that the candidate pixels $x_b$, $x_c$ and $x_d$ have satisfied the three conditions 1 to 3 in the candidate pixels $x_a$ to $x_d$. Therefore, the candidate pixels $x_b$, $x_c$, and $x_d$ are selected as the pixels which are high in possibility that they are situated on the boundary between the lung and the liver.

Figure 19:
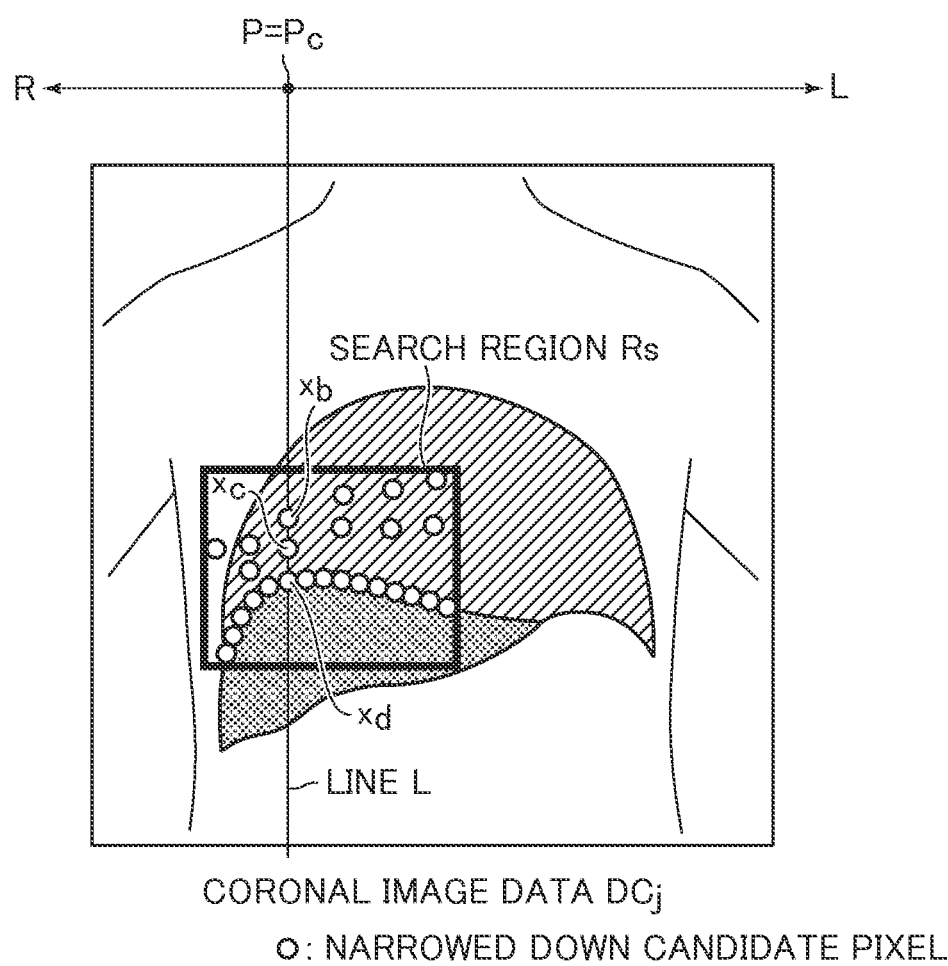
FIG. 19 is a diagram schematically showing the candidate pixels narrowed down from within a search region $R_s$.

In the above-mentioned description, the method of narrowing down the pixels which are high in possibility that they are situated on the boundary between the lung and the liver from within the candidate pixels $x_a$ to $x_e$ which have been extracted on the line L of the coordinate value P=Pc is described. However, the pixels which are high in possibility that they are situated on the boundary between the lung and the liver can be narrowed down by the same method also in a case where two or more candidate pixels are extracted on the line L of a coordinate value other than Pc. Therefore, the pixels which are high in possibility that they are situated on the boundary between the lung and the liver can be narrowed down from within all the candidate pixels in the search region Rs. The candidate pixels which have been narrowed down from within the search region Rs are schematically shown in FIG. 19. In FIG. 19, the narrowed-down pixel is indicated by "o". After the pixels have been narrowed down, it proceeds to step ST92.

In step ST92, the identification means 87b (see FIG. 1) specifies the pixel which is situated on the boundary between the lung and the liver from within the narrowed down candidate pixels. For example, referring to FIG. 19, three candidate pixels $x_b$, $x_c$ and $x_d$ are narrowed down on the line of the coordinate value P=Pc. However, the pixel which is situated on the boundary between the lung and the liver is the candidate pixel $x_d$ in the candidate pixels $x_b$, $x_c$ and $x_d$, and the candidate pixels $x_b$ and $x_c$ are not situated on the boundary between the lung and the liver. Therefore, it is found that also the pixels which are not situated on the boundary between the lung and the liver are narrowed down as the candidate pixels. Thus, it is necessary to identify which pixel is situated on the boundary between the lung and the liver in the narrowed down candidate pixels $x_b$, $x_c$ and $x_d$. In the following, this identification method will be described.

Figure 20:
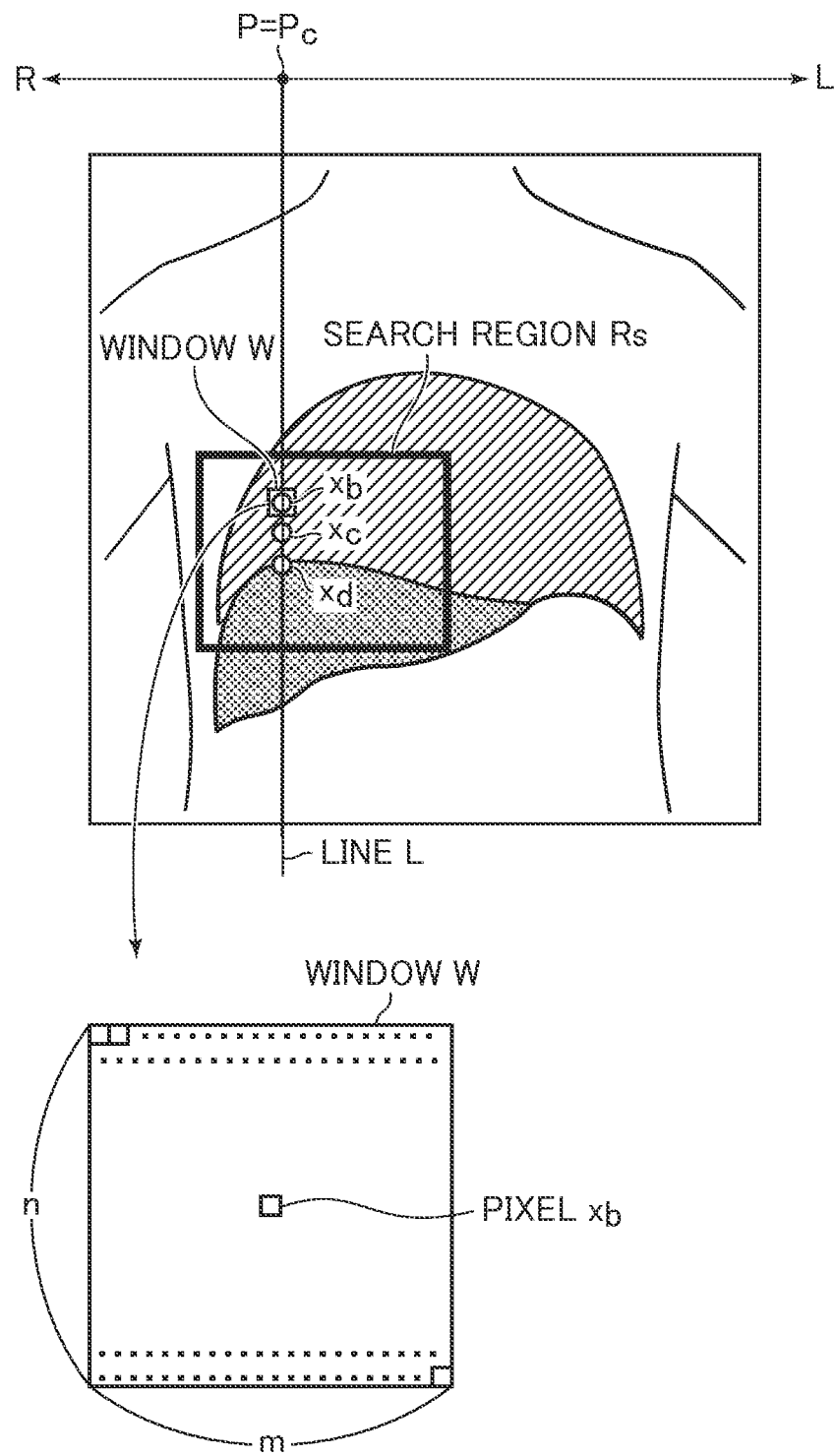
FIG. 20 is an illustration of one example of a method of identifying a pixel which is situated on the boundary of the liver.

FIG. 20 is an illustration of one example of the method of identifying the pixel situated on the boundary between the lung and the liver. First, a window W is set centering on the candidate pixel $x_b$. The size of the window W is a pixel size of n×m (for example, a pixel size of 19×19). Then, whether the pixel $x_b$ is situated on the boundary between the lung and the liver is decided by using identifiers. In the following, the identifiers used in the present embodiment will be described.

Figure 21:
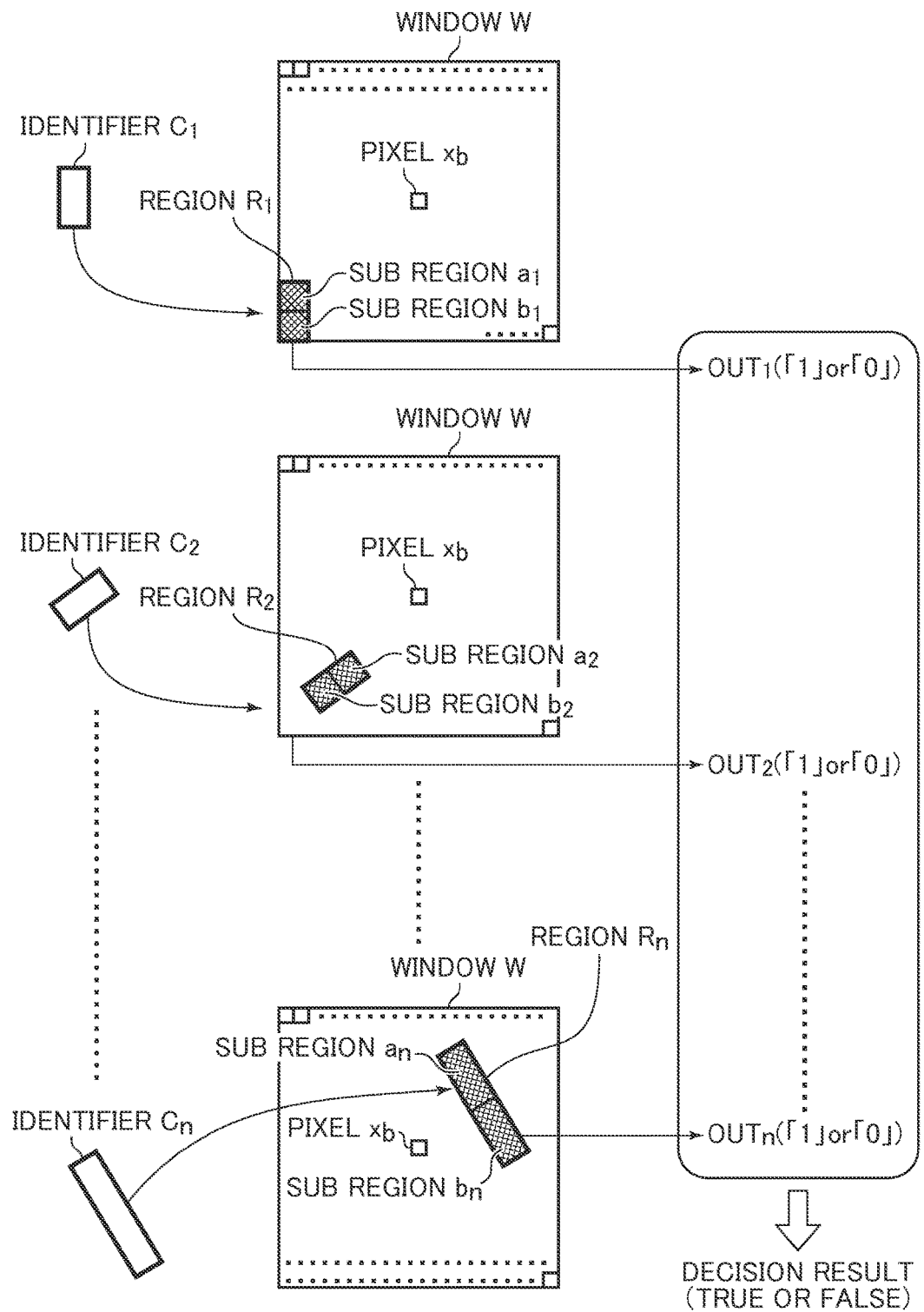
FIG. 21 is an illustration of identifiers used in the present embodiment.

FIG. 21 is an illustration of the identifiers used in the present embodiment. An identifier $C_i$ (i=1 to n) is prepared in advance before imaging the subject. In the present embodiment, the identifier $C_i$ is prepared using AdaBoost which is an algorithm of machine learning. Specifically, the identifier $C_i$ suited for detecting the boundary between the lung and the liver is prepared by preparing supervised data (for example, image data of a section crossing the lung and the liver of a real human beings) and making it learn the supervised data by AdaBoost.

The identifier $C_i$ decides whether a pixel value in a region $R_i$ in the window W satisfies a predetermined condition. Specifically, two sub regions $a_i$ and $b_i$ are thought of in the region $R_i$ and whether the pixel values in the sub region $a_i$ and the pixel values in the sub region $b_i$ satisfy the following formula (4). Then, the identifier $C_i$ outputs an output value $OUT_i$ according to a result of decision. In the present embodiment, in a case where they satisfy the formula (4), an output value $OUT_i=1$ is output, and in a case where they do not satisfy the formula (4), an output value $OUT_i=0$ is output. $VA_i-VB_i>TH_i$ . . . (4) Here, $VA_i$: a mean value of respective pixels in the sub region $a_i$, $VB_i$: a mean value of respective pixels in the sub region $b_i$, $TH_i$: a threshold value of the region $R_i$ obtained by AdaBoost For example, the identifier $C_1$ of i=1 sets i in the formula (4) as i=1 and decides whether the pixel values in the sub region $a_1$ and the pixel values in the sub region $b_1$ in the region $R_1$ satisfy the formula (4). Then, the identifier $C_1$ outputs $OUT_1=1$ in a case where they satisfy the formula (4) and outputs $OUT_1=0$ in a case where they do not satisfy the formula (4).

Then, identifiers $C_2$ to $C_n$ of i=2 to n set i in the formula (4) as i=2 to n and decide whether they satisfy the formula (4) similarly. Then, the identifiers $C_2$ to $C_n$ output OUTi=1 in a case where they satisfy the formula (4), and output OUTi=0 in a case where they do not satisfy the formula (4).

Next, the identification means 87b decides whether the output values exceeding a half of the output values $OUT_1$ to $OUT_n$ ("1" or "0") of the identifiers $C_1$ to $C_n$ have output "1s". In a case where the output values exceeding a half of the output values $OUT_1$ to $OUT_n$ are "1s", the identification means 87b outputs a decision result true indicating that the pixel is situated on the boundary between the lung and the liver. On the other hand, in a case where the output values exceeding a half of the output values $OUT_1$ to $OUT_n$ are not "1s", the identification means 87b outputs a decision result false indicating that the pixel is not situated on the boundary between the lung and the liver. Although, in FIG. 21, the decision result (true or false) pertaining to the pixel $x_b$ is shown, the window W is set and the decision result (true or false) is obtained using the identifiers $C_1$ to $C_n$ also with respect to other pixels $x_c$ and $x_d$. Therefore, whether the pixel is situated on the boundary between the lung and the liver can be decided with respect to each of the pixels $x_b$, $x_c$ and $x_d$. Here, it is assumed that while the decision result of the pixels $x_b$ and $x_c$ is false, the decision result of the pixel $x_d$ is true. Therefore, it can be decided that the pixel $x_d$ is situated on the boundary between the lung and the liver.

The identifiers $C_1$ to $C_n$ prepared by AdaBoost are weak identifiers when seeing them individually. However, high identification ability can be obtained by using the identifiers $C_1$ to $C_n$ in combination. Therefore, the precision in detection of the pixel situated on the boundary between the lung and the liver can be improved by using the above-mentioned identifiers $C_1$ to $C_n$.

Figure 22:
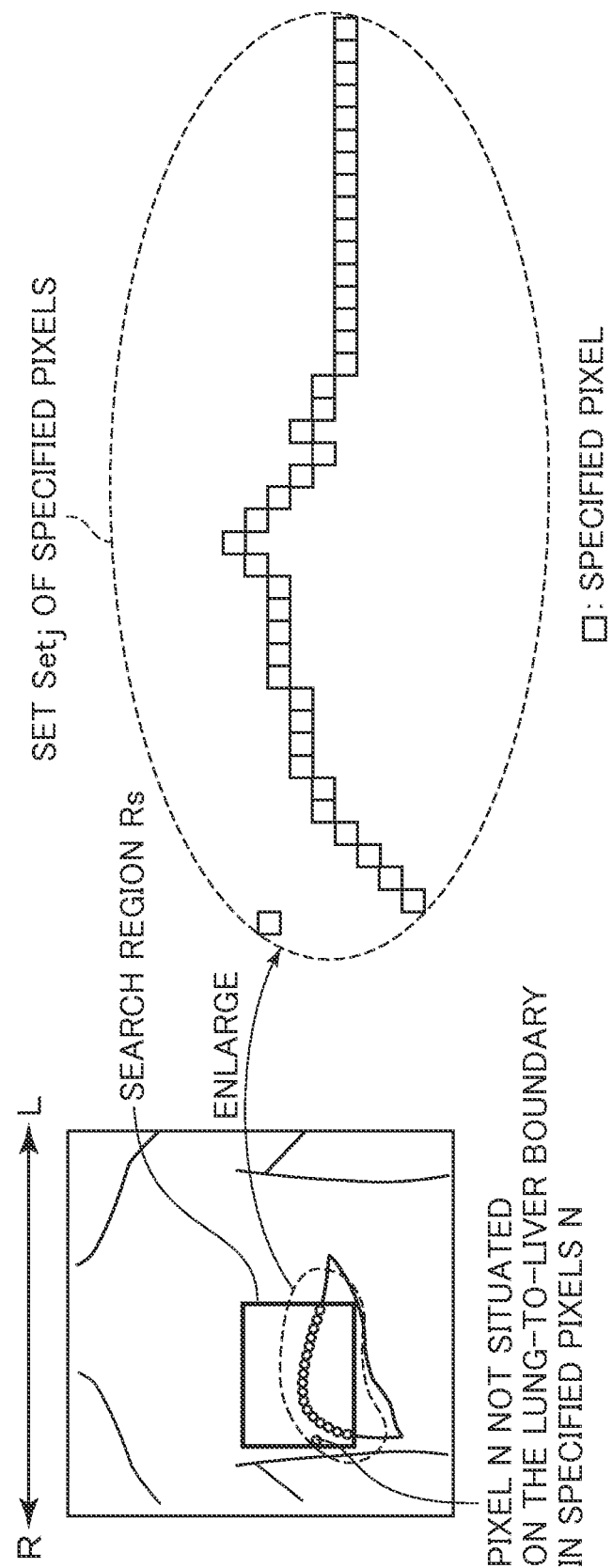
FIG. 22 is a diagram schematically showing pixels which have been specified within the search region $R_s$ of the coronal plane $CO_j$.

In FIG. 20 and FIG. 21, the method of identifying the pixel $x_d$ situated on the boundary between the lung and the liver from within the candidate pixels $x_b$, $x_c$ and $x_d$ which have been narrowed down on the line L of the coordinate value P=Pc is described. However, the pixel situated on the boundary between the lung and the liver can be identified also from within candidate pixels which have been narrowed down on the line L of a coordinate value other than Pc by the same method. Therefore, the pixel which is situated on the boundary between the lung and the liver can be specified from within the candidate pixels in the search region Rs. Pixels which have been specified in the search region Rs on the coronal plane $CO_j$ are schematically shown in FIG. 22. In FIG. 22, a set of specified pixels is designated by a symbol "Setj". Incidentally, since a pixel N which is not situated on the boundary between the lung and the liver is also present in the specified pixels, it is necessary to exclude the pixel N from within the pixels situated on the boundary between the lung and the liver. As a method of excluding the pixel N from within the pixels situated on the boundary between the lung and the liver, there exists a method of using a differential value of the pixel N in differentiated image data. In general, there is a tendency that the absolute value of the differential value of the pixel which is not situated on the boundary between the lung and the liver becomes smaller than the absolute value of the differential value of the pixel which is situated on the boundary between the lung and the liver. Therefore, whether the pixel N is situated on the boundary between the lung and the liver can be decided by preparing a threshold value for deciding whether the absolute value of the differential value of a pixel is large or small and deciding whether the absolute value of the differential value of the pixel N is smaller than the threshold value.

Figure 23:
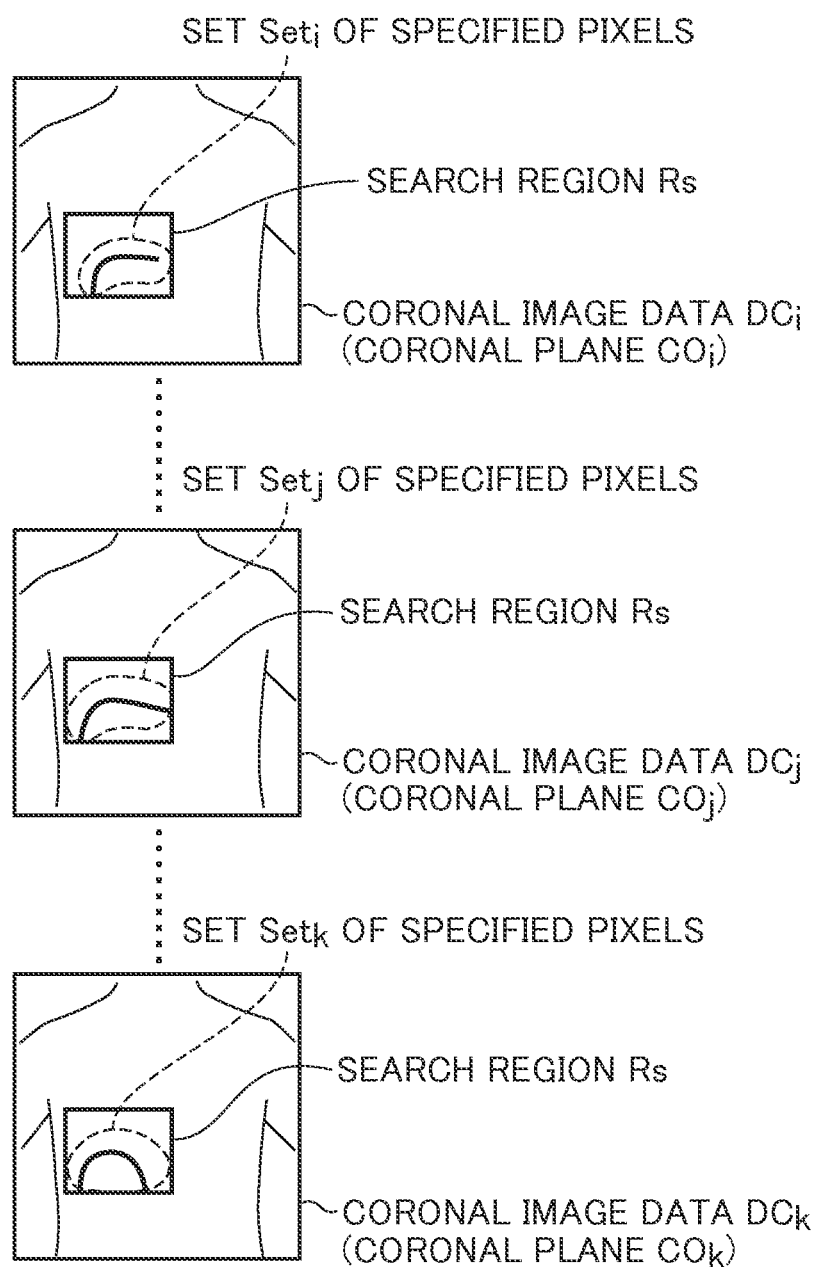
FIG. 23 is a diagram schematically showing sets $Set_i$ to $Set_k$ of pixels which have been specified for each of coronal planes $CO_i$ to $CO_k$.

Although, in the above-mentioned description, a case of specifying the pixel situated on the boundary between the lung and the liver on the coronal plane $CO_j$ has been described, also in a case where pixels which are situated on the boundary between the lung and the liver are to be specified on other coronal planes, they can be specified by the same method. Therefore, the pixel which is situated on the boundary between the lung and the liver can be specified on each of the coronal planes $CO_i$ to $CO_k$. Sets Seti to Setk of pixels which have been specified on the respective coronal planes $CO_i$ to $CO_k$ are schematically shown in FIG. 23. After the pixels situated on the boundary between the lung and the liver have been specified, it proceeds to step ST10.

In step ST10, the navigator region determination means 88 (see FIG. 1) determines the position of the navigator region. In the following, respective steps ST101 to ST104 in step ST10 will be described.

Figure 24:
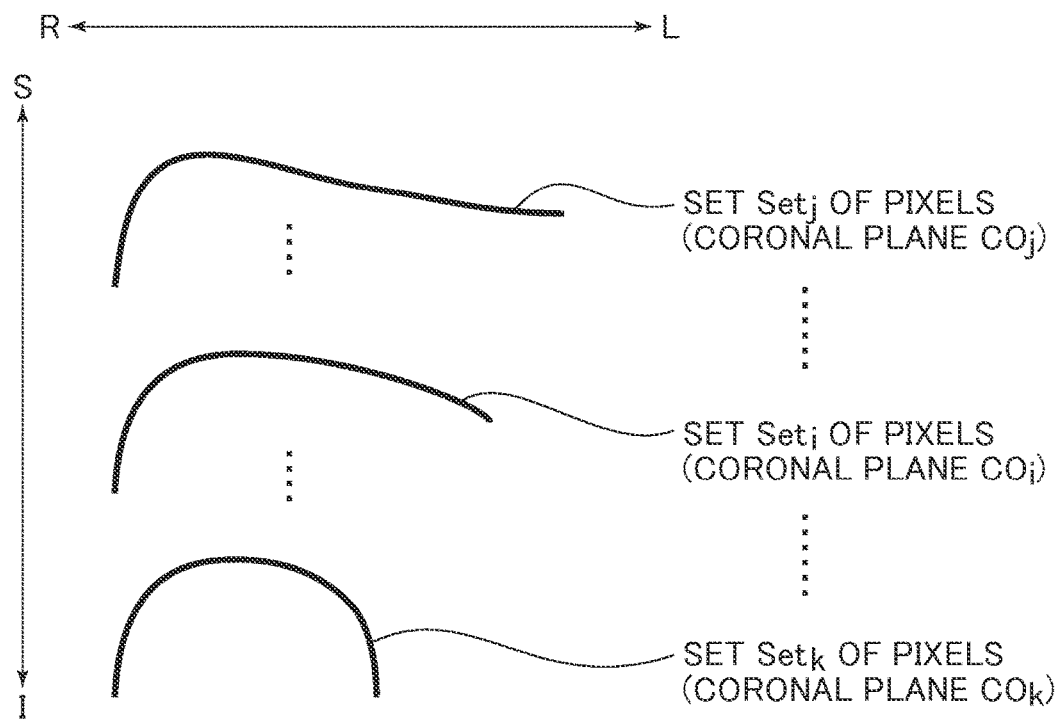
FIG. 24 is an illustration when selecting a set of pixels to be used when deciding the position of a navigator region from within the sets $Set_i$ to $Set_k$ of pixels.

In step ST101, the navigator region determination means 88 selects a set of pixels to be used when determining the position of the navigator region from within the sets Seti to Setk (see FIG. 23) of the pixels on the coronal planes $CO_i$ to $CO_k$ (see FIG. 24).

FIG. 24 is an illustration when selecting the set of pixels to be used when determining the position of the navigator region from within the sets Seti to Setk of pixels. In FIG. 24, only the sets Seti, Setj and Setk of pixels in the sets Seti to Setk of pixels are representatively shown for the convenience of description.

In the present embodiment, in the sets Seti to Setk of pixels, the set of pixels which is situated closest to the S side is selected as the set of pixels to be used when determining the position of the navigator region. Referring to FIG. 24, in the sets Seti to Setk of pixels, the set of pixels which is situated closest to the S side is Setj. Therefore, the navigator region determination means 88 selects the set Setj of pixels on the coronal plane $CO_j$ from within the sets Seti to Setk of pixels. After the set Setj of pixels has been selected, it proceeds to step ST102.

Figure 25:
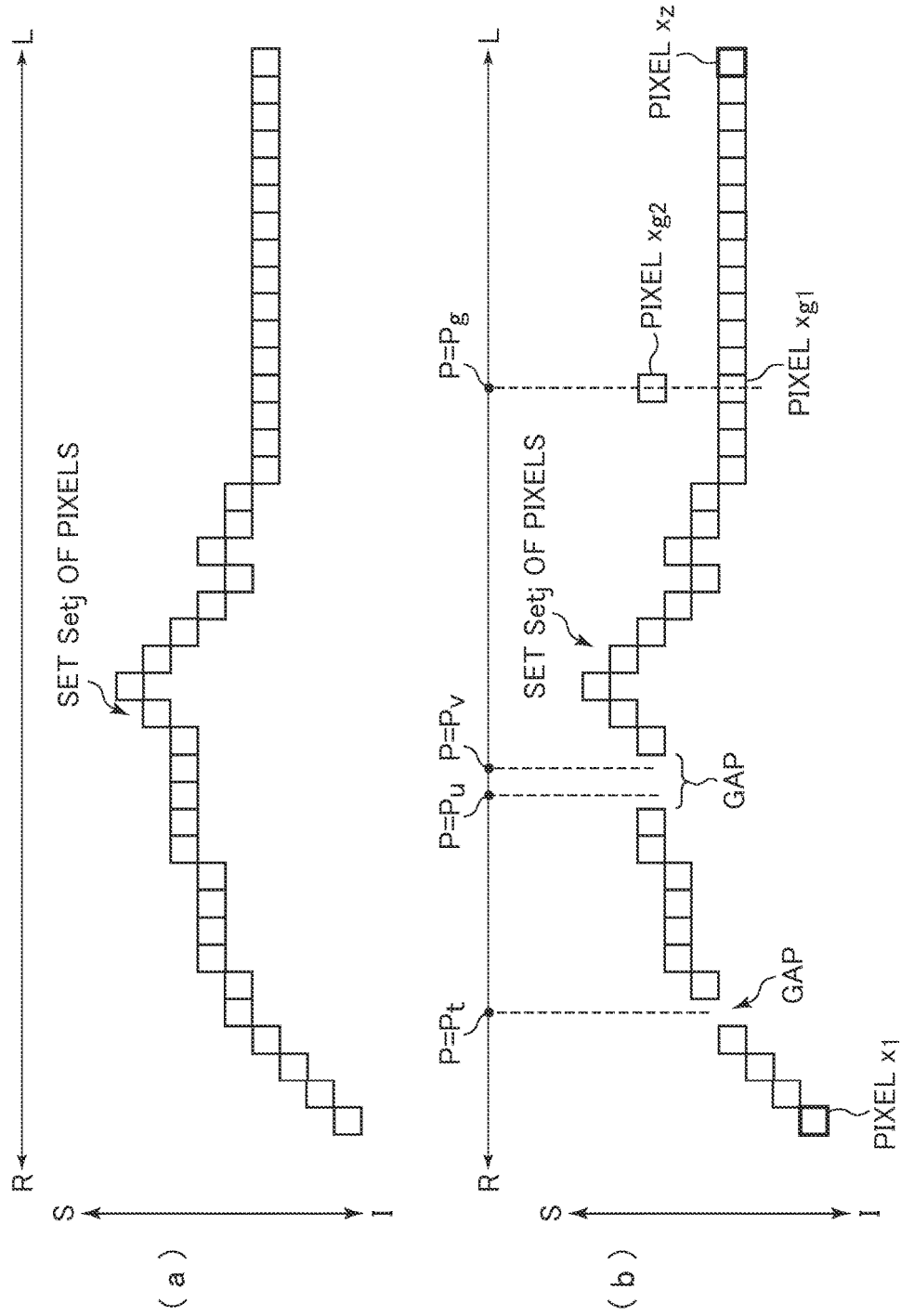
FIG. 25 are illustrations of preprocessing.

In step ST102, the navigator region determination means 88 performs preprocessing on the selected set Setj of pixels (see FIG. 25).

FIG. 25 is illustrations of preprocessing. The boundary between the lung and the liver runs continuously. Therefore, the set Setj of pixels must run continuously ideally as shown in FIG. 25(*a*). However, in some cases, the ideal set Setj of pixels cannot be obtained in reality. An example thereof is shown in FIG. 25(*b*). In FIG. 25(*b*), there exists a gap of pixels in the coordinate values $P=P_t$, $P_u$ and $P_v$, and two pixels $x_{g1}$ and $x_{g2}$ in the coordinate value $P=P_g$ are specified as the pixels situated on the boundary between the lung and the liver.

Figure 26:
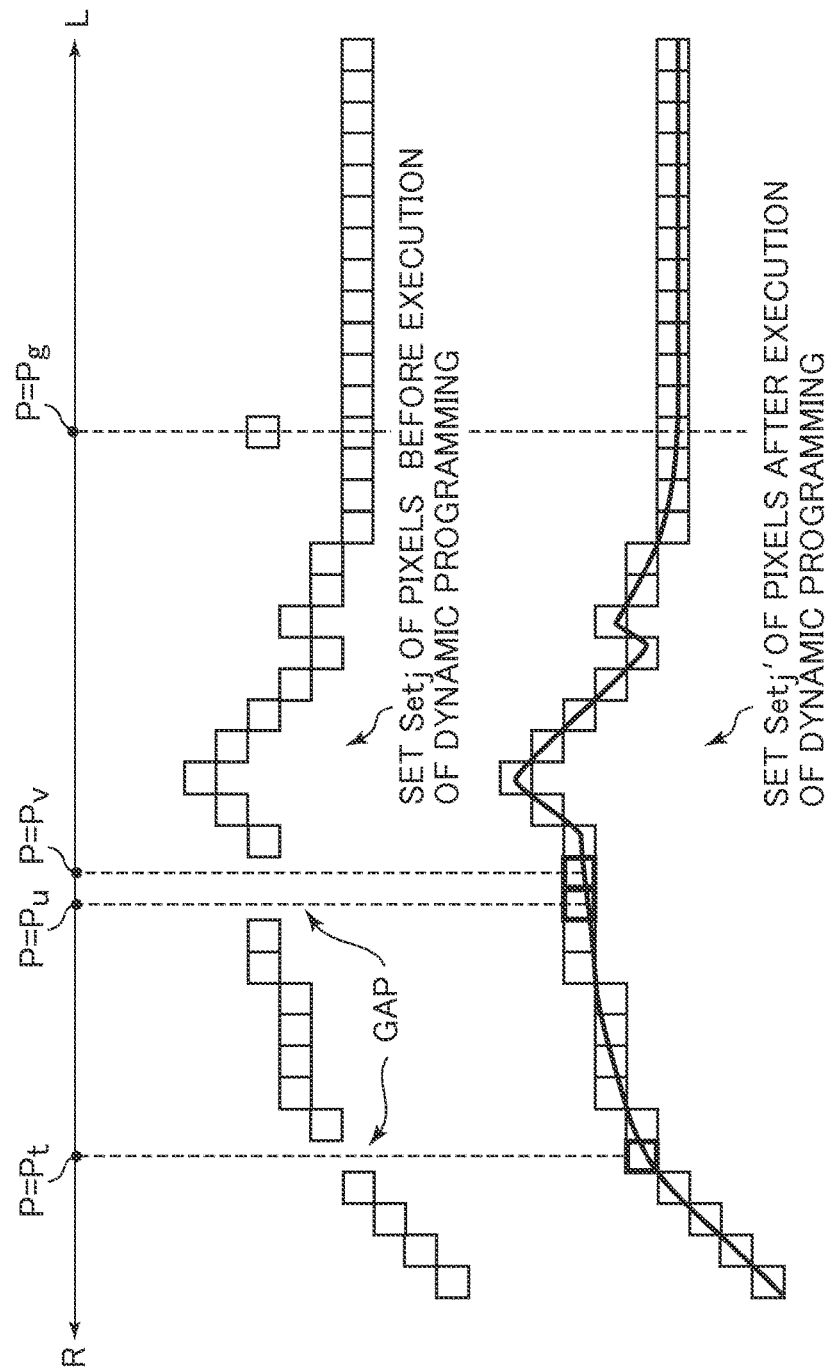
FIG. 26 is a diagram schematically showing a set $Set_j$ of pixels before a process of dynamic programming is performed and a set of $Set_{j'}$ of pixels after the process of dynamic programming has been performed.

Thus, the navigator region determination means 88 performs a process for making the set Setj of pixels run continuously. As a method of making the set Setj of pixels run continuously, for example, dynamic programming can be used. In the dynamic programming, first, by setting a pixel $x_1$ which is situated closest to the R side as a start point and setting a pixel $x_z$ which is situated closest to the L side as an end point, a plurality of paths connecting the start point and the end point are thought of. Then, an additional value of reciprocals of differential values of the pixels is calculated per path, and a path when the additional value is minimized is specified and a pixel on the specified path is used as the pixel which bridges the gap. The set Setj of pixels before the process of dynamic programming is performed and a set Setj' of pixels after the process of dynamic programming has been executed are schematically shown in FIG. 26. The pixels can be connected by using the dynamic programming as mentioned above. After the pixels have been connected, it proceeds to step ST103.

Figure 27:
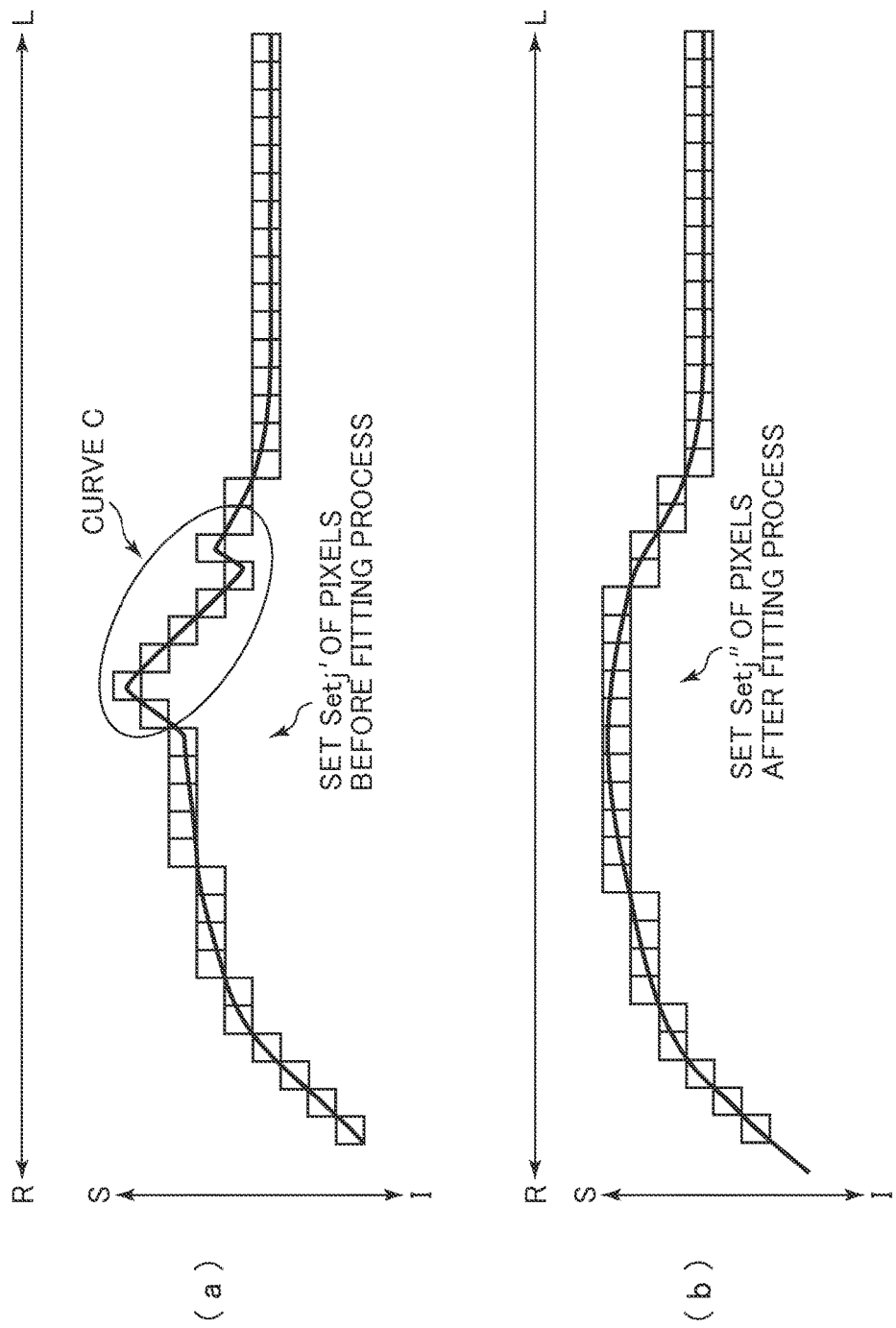
FIG. 27 are illustrations of a fitting process.

In step ST103, the navigator region determination means 88 performs a fitting process on the set Setj' of pixels (see FIG. 27).

FIG. 27 is illustrations of the fitting process. FIG. 27(*a*) shows the set Setj' of pixels before the fitting-process and FIG. 27(*b*) shows a set Setj" of pixels after the fitting-process.

Even if there exists an unnatural curve which would not be observed originally on the boundary between the lung and the liver in the set Setj' of pixels, it can be modified by performing the fitting process. As fitting, for example, polynomial fitting (for example, quadratic fitting) can be used. After the fitting process has been executed, it proceeds to step ST104.

Figure 28:
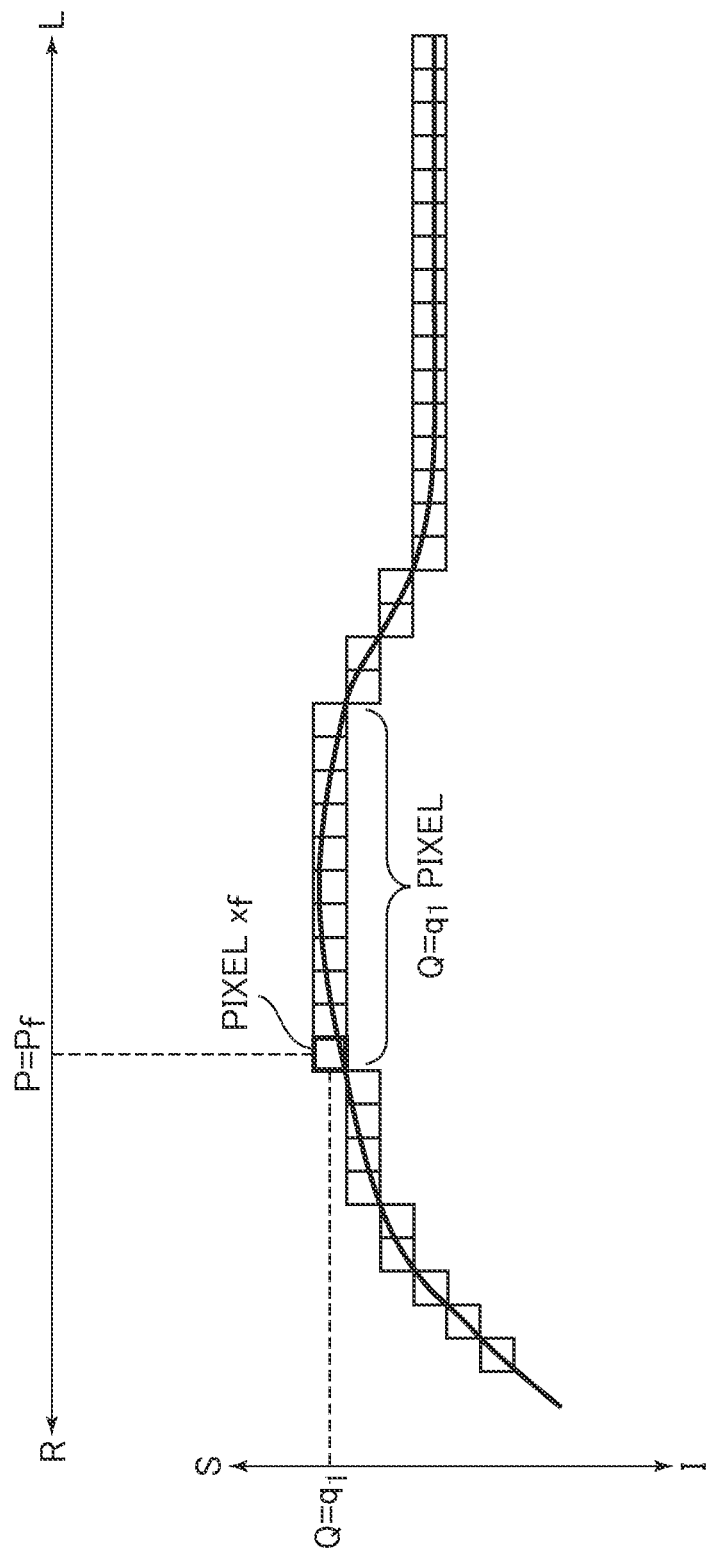
FIG. 28 is an illustration when detecting a pixel which is situated closest to an S-direction side.

In step ST104, the pixel which is situated closest to the S-direction side is detected from within the set Setj" of pixels after the fitting process (see FIG. 28).

Figure 29:
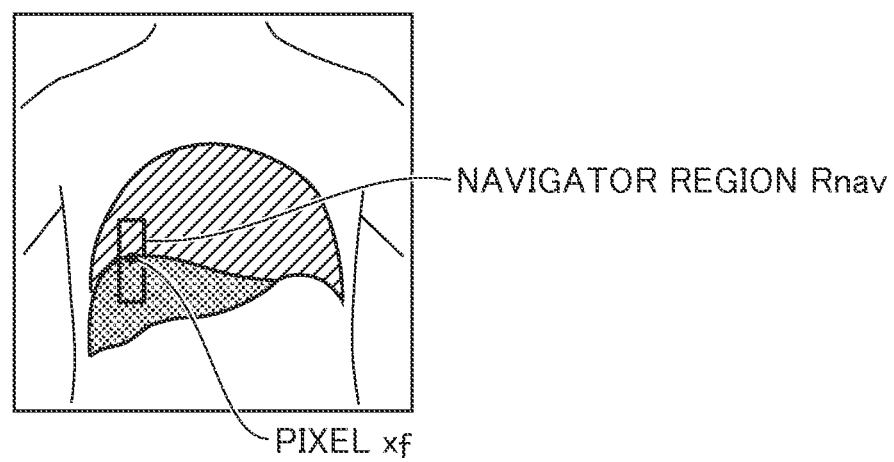
FIG. 29 is a diagram schematically showing the position of a navigator region $R_{nav}$.

FIG. 28 is an illustration when detecting the pixel which is situated closest to the S-direction side. In FIG. 28, a coordinate value Q of the pixel which is situated closest to the S-direction side is $Q=q_1$. Incidentally, plural ones exist as the pixel of the coordinate value $q_1$. In this case, any one of the pixels is detected from within the plurality of pixels. In the present embodiment, a pixel $x_f$ which is situated closest to the R side is detected from within the pixels of the coordinate value $q_1$. The position of the pixel $x_f$ so detected is determined as the position of the navigator region $R_{nav}$. The position of the navigator region $R_{nav}$ is schematically shown in FIG. 29. The coordinate value P in the RL direction of the pixel $x_f$ is $P=P_f$ and the coordinate value Q thereof in the SI direction is $Q=q_1$. In addition, since the pixel $x_f$ is included in the coronal plane $CO_j$, the coordinate value in the AP direction of the coronal plane $CO_j$ will be the coordinate value in the AP direction of the pixel $x_f$. Therefore, since the coordinate values in three directions (the RL direction, the SI direction and the AP direction) of the pixel $x_f$ are obtained, the navigator region $R_{nav}$ can be set at the position of the pixel $x_f$. Since the navigator region $R_{nav}$ can be separated from the heart by setting the position of the pixel $x_a$ which is situated closest to the R side as the position of the navigator region $R_{nav}$, degradation of the respiratory signal caused by hear beat can be reduced. After the position of the navigator region $R_{nav}$ has been determined, it proceeds to step ST11.

In step ST11, a main scan is executed. In the main scan, a navigator sequence for collecting the respiratory signals from the navigator region $R_{nav}$ and an imaging sequence for collecting image data of the part including the liver are executed. At the completion of the main scan, the flow is terminated.

In the present embodiment, the candidate pixels acting as the candidates for the pixel which is situated on the boundary between the lung and the liver are extracted on the basis of the image data of the coronal plane (the coronal image data) crossing the lung and the liver. Next, the candidate pixels which are high in possibility that they are situated on the boundary between the lung and the liver are narrowed down from within the extracted candidate pixels. Then, the pixel situated on the boundary between the lung and the liver is specified from within the narrowed down candidate pixels by using the identifiers $C_1$ to $C_n$ which have been prepared by AdaBoost. Since the high identification ability can be obtained by using the identifiers $C_1$ to $C_n$ in combination, the detection precision of the pixel situated on the boundary between the lung and the liver can be improved. In addition, since the position of the navigator region $R_{nav}$ is determined on the basis of the sets Seti to Setk of pixels specified on the respective coronal planes $CO_i$ to $CO_k$, the navigator region can be set on the boundary between the lung and the liver and acquisition of the favorable respiratory signals becomes possible. Further, since the operator needs not find out the position of the navigator region, the work load on the operator can be also reduced.

In the present embodiment, in a case where the pixels which are high in possibility that they are situated on the boundary between the lung and the liver are to be narrowed down from within the candidate pixels, the mean value M1 of the pixel values of the pixels in the region V and the mean value M2 of the pixel values of the pixels in the region W are used (see FIG. 17 and FIG. 18). However, if the pixels situated on the boundary between the lung and the liver can be narrowed down, a feature quantity different from the mean value of the pixel values may be used. For example, a central value (a median) of the pixel values of the pixels in the region V and a central value (a median) of the pixel values of the pixels in the region W may be used.

In the present embodiment, the candidate pixels which are high in possibility that they are situated on the boundary between the lung and the liver are narrowed down from within the candidate pixels and the identifiers are applied to the narrowed down candidate pixels, thereby specifying the pixel which is situated on the boundary between the lung and the liver. However, the pixel which is situated on the boundary between the lung and the liver may be specified by applying the identifiers to all the candidate pixels without performing the process of narrowing down the candidate pixels.

Although in the present embodiment, the example of setting the navigator region on the boundary between the lung and the liver is described, the present invention is not limited to the case of setting the navigator region on the boundary between the lung and the liver and can be also applied to a case of setting the navigator region on another boundary.

Although in the present embodiment, the image data of the n coronal planes $CO_1$ to $CO_n$ are acquired in the localizer scan LS, only the image data of one coronal plane crossing the liver and the lung may be acquired. However, in order to position the navigator region $R_{nav}$ at a more optimum position, it is desirable to acquire the image data of the plurality of coronal planes in the localizer scan LS.

In the preset embodiment, the identifier $C_i$ decides whether the pixel is situated on the boundary between the lung and the liver by using the formula (4). However, whether the pixel is situated on the boundary between the lung and the liver may be decided by using a formula other than the formula (4).

In the present embodiment, the image data of the m axial planes $AX_1$ to $AX_m$ are acquired in the localizer scan LS. However, only the image data of one axial plane crossing the liver may be acquired to obtain the region To (see FIG. 7) in the AP direction of the liver and the range $W_{RL}$ (see FIG. 8) in the RL direction which is high in possibility that the upper end of the liver is situated.

Although in the present embodiment, the position of the navigator region $R_{nav}$ is determined on the basis of the coronal image data, the position of the navigator region $R_{nav}$ may be determined on the basis of image data of a plane (for example, an oblique plane obliquely intersecting with the coronal plane) other than the coronal plane.

Although in the present embodiment, it proceeds to step ST3 after the fat has been removed in step ST2, it may proceed to step ST3 without performing fat removal in step ST2.

(2) Second Embodiment

In the following, a second embodiment will be described while referring to the flow shown in FIG. 4. Incidentally, the hardware configuration of the MR device of the second embodiment is the same that of the first embodiment.

Since step ST1 to step ST8 and step ST91 are the same as those in the first embodiment, description thereof is omitted. After narrowing down the candidate pixels in step ST91, it proceeds to step ST92.

In step ST92, the pixel which is situated on the boundary between the lung and the liver is specified from within the narrowed down candidate pixels. In the following, a specification method will be described.

First, as shown in FIG. 20, the window W is set centering on the candidate pixel $x_b$. The size of the window W is a pixel size of n×m (for example, a pixel size of 19×19). It is the same as the first embodiment in that the window W is set. After the window W has been set, whether the pixel $x_b$ is situated on the boundary between the lung and the liver is decided (see FIG. 30).

Figure 30:
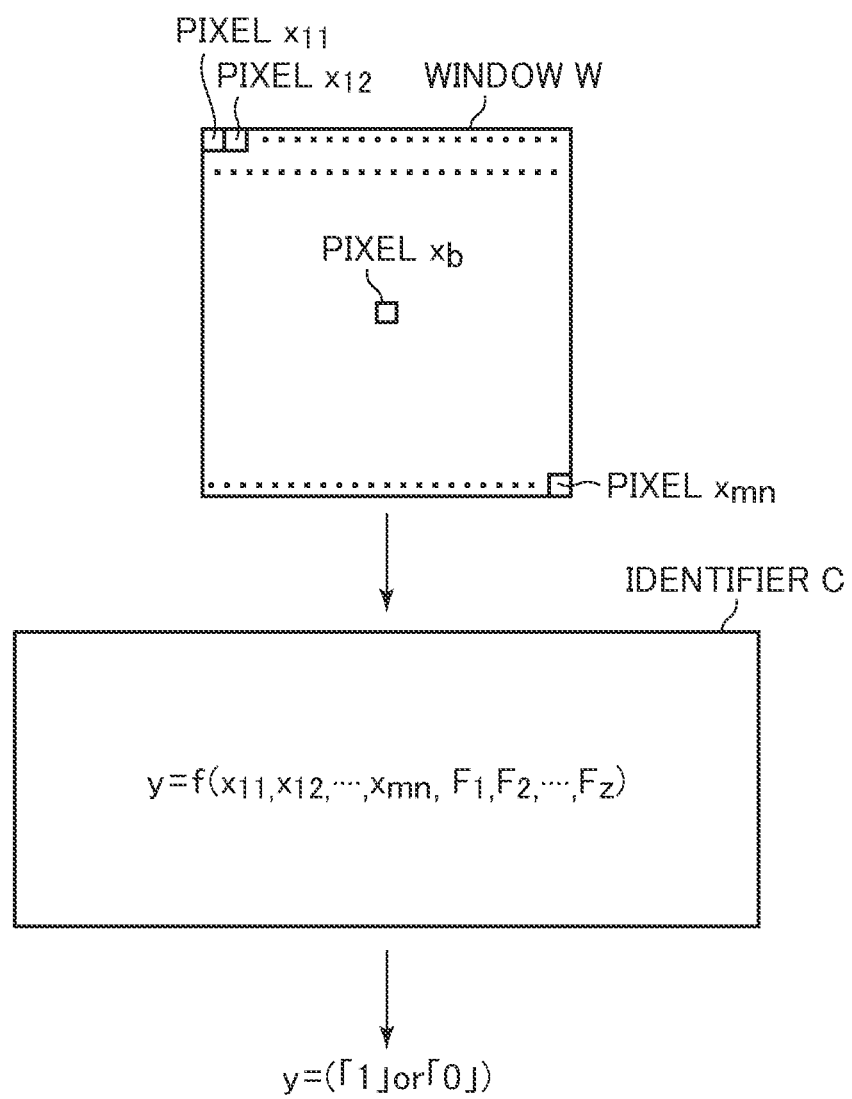
FIG. 30 is an illustration of a method of deciding whether a pixel $x_b$ is situated on the boundary between the lung and the liver in a second embodiment.

FIG. 30 is an illustration of a method of deciding whether the pixel $x_b$ is situated on the boundary between the lung and the liver in the second embodiment. The identification means 87b (see FIG. 1) decides whether the pixel $x_b$ is situated on the boundary between the lung and the liver using the identifier C. The identifier C uses a formula y in order to decide whether the pixel $x_b$ is situated on the boundary between the lung and the liver. The formula y includes pixels values $x_{11}$ to $x_{mn}$ of the respective pixels within the window W as variables. In addition, the formula y also includes factors $F_1$ to $F_z$. The factors $F_1$ to $F_z$ are determined in advance using Support Vector Machine which is an algorithm of machine learning. The factors $F_1$ to $F_z$ can be determined, for example, in the following procedure.

First, supervised data is prepared. The supervised data is image data of, for example, a section crossing the lung and the liver of a real human beings. Then, a hyperplane for separating the supervised data into two kinds of data (data on a pixel which is situated on the boundary between the lung and the liver and data on a pixel which is not situated on the boundary between the lung and the liver) is obtained. At that time, values of the factors $F_1$ to $F_z$ are obtained such that the hyperplane has a maximum margin.

The identifier C decides whether the pixel $x_b$ is situated on the boundary between the lung and the liver using the formula y including the factors $F_1$ to $F_z$ so obtained. Specifically, the identifier C substitutes the pixel values $x_{11}$ to $x_{mn}$ of the respective pixels in the window W into the formula y. While in a case where the pixel $x_b$ is situated on the boundary between the lung and the liver, y=1, in a case where the pixel $x_b$ is not situated on the boundary between the lung and the liver, y=0. Therefore, whether the pixel $x_b$ is situated on the boundary between the lung and the liver can be decided from the value of y. In FIG. 30, description on the pixel $x_b$ is made. However, also with respect to other pixels $x_c$ and $x_d$, whether they are situated on the boundary between the lung and the liver can be decided by setting the window W centering on the pixels $x_c$ and $x_d$ and substituting the pixel values of the pixels in the window W into the formula y. Here, although y=0 for the pixels $x_b$ and $x_c$, y=1 for the pixel $x_d$. Therefore, it can be decided that the pixel $x_d$ is situated on the boundary between the lung and the liver.

The pixel which is situated on the boundary between the lung and the liver can be specified from within the candidate pixels in the search region $R_s$ in the above mentioned manner. After the pixel which is situated on the boundary between the lung and the liver has been specified, it proceeds to step ST10 and step T11 and the flow is terminated.

In the second embodiment, the factors $F_1$ to Fz in the formula y are obtained by Support Vector Machine. Since the factors $F_1$ to Fz are determined such that the hyperplane has the maximum margin, the detection precision of the pixel situated on the boundary between the lung and the liver can be improved.

Incidentally, in the first embodiment, AdaBoost is used as the algorithm of machine learning, and in the second embodiment, Support Vector Machine is used as the algorithm of machine learning. However, the algorithms of machine learning are not limited to these and, for example, Neural Network may be used.

Many widely different embodiments of the invention may be configured without departing from the spirit and the scope of the present invention. It should be understood that the present invention is not limited to the specific embodiments described in the specification, except as defined in the appended claims.

INDUSTRIAL APPLICABILITY

The present invention is applied to the apparatus which specifies the pixel situated on the boundary from within the plurality of candidate pixels by using the identifier, and the apparatus can improve the detection precision of the position of the boundary.

The invention claimed is:

1. A detection apparatus for detecting the position of a boundary between a first part and a second part of a subject, the detection apparatus comprising:
    a pixel extraction unit for extracting a plurality of candidate pixels acting as candidates for a pixel situated on the boundary on the basis of image data of a first section crossing the first part and the second part; and
    a pixel specification unit for specifying the pixel situated on the boundary from within the plurality of candidate pixels by using an identifier which has been prepared by using an algorithm of machine learning;
    wherein the pixel specification unit narrows down candidate pixels which are high in possibility that they are situated on the boundary from within the plurality of candidate pixels, and specifies the pixel which is situated on the boundary from within the narrowed-down candidate pixels by using the identifier.

2. The detection apparatus according to claim 1, wherein the identifier is prepared by making it learn supervised data by AdaBoost.

3. The detection apparatus according to claim 1, wherein the identifier is prepared by making it learn supervised data by Support Vector Machine.

4. The detection apparatus according to claim 1, further comprising a navigator region determination unit for determining the position of the navigator region on the basis of the specified pixel.

5. The detection apparatus according to claim 4,
    wherein the pixel extraction unit extracts the plurality of candidate pixels per the first section on the basis of image data of a plurality of first sections crossing the first part and the second part;
    the pixel specification unit specifies a set of pixels situated on the boundary per the first section; and
    the navigator region determination unit selects a set of pixels to be used for determining the position of the navigator region from within the sets of pixels specified per the first section, and determines the position of the navigator region on the basis of the selected set of pixels.

6. The detection apparatus according to claim 5, wherein the navigator region determination unit decides whether there exists a gap of pixels in the selected set of pixels, when there exists the gap of pixels, bridges the gap of pixels and determines the position of the navigator region on the bases of the set of pixels after the gap of pixels has been bridged.

7. The detection apparatus according to claim 6, wherein the navigator region determination unit performs a fitting process on the set of pixels after the gap of pixels has been bridged and determines the position of the navigator region on the basis of the set of pixels after fitting-processed.

8. The detection apparatus according to claim 7, wherein the navigator region determination unit determines a pixel situated at the uppermost position in the set of pixels after fitting-processed as the position of the navigator region.

9. The detection apparatus according to claim 1, wherein image data of the first section is differentiated image data.

10. The detection apparatus according to claim 9, wherein the pixel extraction unit obtains a profile of differential values of pixels on a line crossing the boundary using the differentiated image data and extracts the candidate pixels on the basis of the profile.

11. The detection apparatus according to claim 10, wherein the pixel specification unit narrows down pixels which are high in possibility that they are situated on the boundary from within the two or more candidate pixels on the basis of pixel values of pixels situated around each candidate pixel on the line, in a case where two or more candidate pixels have been extracted on the line.

12. The detection apparatus according to claim 11, wherein the pixel specification unit sets a first region and a second region for the candidate pixels, and narrows down pixels which are high in possibility that they are situated on the boundary on the basis of pixel values of pixels included in the first region and pixel values of pixels included in the second region.

13. The detection apparatus according to claim 1, wherein the pixel extraction unit obtains a search region including the boundary, and extracts the candidate pixels from within the search region.

14. The detection apparatus according to claim 13, wherein in a case where search region is to be obtained, image data of a second section intersecting with the first section is used.

15. The detection apparatus according to claim 14, wherein the first section is a coronal plane and the second section is an axial plane.

16. The detection apparatus according to claim 1, wherein the image data is image data that fat has been removed.

17. The detection apparatus according to claim 1, wherein the first part is the lung and the second part is the liver.

18. A magnetic resonance apparatus for detecting the position of a boundary between a first part and a second part of a subject, the magnetic resonance apparatus comprising:
    a pixel extraction unit for extracting a plurality of candidate pixels acting as candidates for a pixel situated on the boundary on the basis of image data of a first section crossing the first part and the second part; and
    a pixel specification unit for specifying the pixel situated on the boundary from within the plurality of candidate pixels by using an identifier which has been prepared by using an algorithm of machine learning;
    wherein the pixel specification unit narrows down candidate pixels which are high in possibility that they are situated on the boundary from within the plurality of candidate pixels, and specifies the pixel which is situated on the boundary from within the narrowed-down candidate pixels by using the identifier.

19. A detection method of detecting the position of a boundary between a first part and a second part of a subject, the detection method comprising:
    the pixel extraction step of extracting a plurality of candidate pixels acting as candidates for a pixel situated on the boundary on the basis of image data of a first section crossing the first part and the second part; and the pixel specification step of specifying the pixel situated on the boundary from within the plurality of candidate pixels by using an identifier which has been prepared by using an algorithm of machine learning;

wherein the pixel specification step narrows down candidate pixels which are high in possibility that they are situated on the boundary from within the plurality of candidate pixels, and specifies the pixel which is situated on the boundary from within the narrowed-down candidate pixels by using the identifier.

* * * * *